US008221909B2

(12) United States Patent
Aytug et al.

(10) Patent No.: US 8,221,909 B2
(45) Date of Patent: Jul. 17, 2012

(54) PHASE-SEPARATED, EPITAXIAL COMPOSITE CAP LAYERS FOR ELECTRONIC DEVICE APPLICATIONS AND METHOD OF MAKING THE SAME

(75) Inventors: Tolga Aytug, Knoxville, TN (US); Mariappan Parans Paranthaman, Knoxville, TN (US); Ozgur Polat, Knoxville, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 65 days.

(21) Appl. No.: 12/947,911

(22) Filed: Nov. 17, 2010

(65) Prior Publication Data

US 2011/0160065 A1 Jun. 30, 2011

Related U.S. Application Data

(63) Continuation-in-part of application No. 12/648,748, filed on Dec. 29, 2009.

(51) Int. Cl.
*B32B 9/00* (2006.01)
*B32B 19/00* (2006.01)

(52) U.S. Cl. ............... 428/702; 505/237; 427/62

(58) Field of Classification Search ............... 505/237, 505/238, 236, 500, 470–477, 445–447; 428/699–702, 930; 264/614–627, 681, 129–137; 438/2; 427/62, 255.11, 255.19, 255.29
See application file for complete search history.

(56) References Cited

U.S. PATENT DOCUMENTS

| | | | |
|---|---|---|---|
| 5,739,086 A | 4/1998 | Goyal et al. | |
| 5,741,377 A | 4/1998 | Goyal et al. | |
| 5,898,020 A | 4/1999 | Goyal et al. | |
| 5,944,966 A | 8/1999 | Suetsugu et al. | |
| 5,958,599 A | 9/1999 | Goyal et al. | |
| 6,150,034 A | 11/2000 | Paranthaman et al. | |
| 6,537,689 B2 * | 3/2003 | Schoop et al. | ............. 428/701 |
| 6,646,528 B2 | 11/2003 | Ehrenberg et al. | |

(Continued)

FOREIGN PATENT DOCUMENTS

WO 2009017829 2/2009

OTHER PUBLICATIONS

"An Impressive Patent Portfolio", Internet Article 2006, 1-3, ORNL Review vol. 39(3).

(Continued)

*Primary Examiner* — Colleen Dunn
(74) *Attorney, Agent, or Firm* — Novak Druce + Quigg

(57) ABSTRACT

An electronic component that includes a substrate and a phase-separated layer supported on the substrate and a method of forming the same are disclosed. The phase-separated layer includes a first phase comprising lanthanum manganate (LMO) and a second phase selected from a metal oxide (MO), metal nitride (MN), a metal (Me), and combinations thereof. The phase-separated material can be an epitaxial layer and an upper surface of the phase-separated layer can include interfaces between the first phase and the second phase. The phase-separated layer can be supported on a buffer layer comprising a composition selected from the group consisting of IBAD MgO, LMO/IBAD-MgO, homoepi-IBAD MgO and LMO/homoepi-MgO. The electronic component can also include an electronically active layer supported on the phase-separated layer. The electronically active layer can be a superconducting material, a ferroelectric material, a multiferroic material, a magnetic material, a photovoltaic material, an electrical storage material, and a semiconductor material.

20 Claims, 5 Drawing Sheets

A

B

U.S. PATENT DOCUMENTS

| | | | |
|---|---|---|---|
| 6,756,139 | B2 | 6/2004 | Jia et al. |
| 6,764,770 | B2 | 7/2004 | Paranthaman et al. |
| 6,800,591 | B2 | 10/2004 | Jia et al. |
| 6,884,527 | B2 | 4/2005 | Groves et al. |
| 6,921,741 | B2 | 7/2005 | Arendt et al. |
| 6,933,065 | B2 | 8/2005 | Arendt et al. |
| 7,087,113 | B2* | 8/2006 | Goyal .............................. 117/84 |
| 7,229,498 | B2 | 6/2007 | Norman et al. |
| 7,258,928 | B2 | 8/2007 | Paranthaman et al. |
| 7,261,776 | B2* | 8/2007 | Rupich et al. .................... 117/89 |
| 7,303,815 | B2* | 12/2007 | Yang et al. ...................... 428/357 |
| 7,361,377 | B2* | 4/2008 | Wiesmann et al. .............. 427/62 |
| 7,365,271 | B2 | 4/2008 | Knoll et al. |
| 7,381,318 | B2 | 6/2008 | Yoo et al. |
| 7,432,229 | B2 | 10/2008 | Paranthaman et al. |
| 7,553,799 | B2* | 6/2009 | Paranthaman et al. ........ 505/237 |
| 7,754,510 | B2 | 7/2010 | Wu et al. |
| 7,919,050 | B2* | 4/2011 | Matsuo et al. ................. 422/171 |
| 7,964,440 | B2 | 6/2011 | Salleo et al. |
| 2005/0159298 | A1 | 7/2005 | Rupich et al. |
| 2005/0239659 | A1 | 10/2005 | Xiong et al. |
| 2006/0131563 | A1 | 6/2006 | Salleo et al. |
| 2007/0012975 | A1 | 1/2007 | Arendt et al. |
| 2007/0178227 | A1 | 8/2007 | Hunt et al. |
| 2008/0113870 | A1 | 5/2008 | Lee et al. |
| 2008/0153709 | A1 | 6/2008 | Rupich et al. |
| 2008/0176749 | A1 | 7/2008 | Goyal |
| 2008/0234134 | A1 | 9/2008 | Stan et al. |
| 2009/0036313 | A1 | 2/2009 | Stan et al. |
| 2009/0088325 | A1 | 4/2009 | Goyal |
| 2009/0137401 | A1 | 5/2009 | Paranthaman et al. |
| 2010/0081574 | A1 | 4/2010 | Goyal |

OTHER PUBLICATIONS

Aytug, Tolga., Properties of YBCO on LaMnO3-capped IBAD MgO-templates without Homo-epitaxial MgO layer. 2009 Journal Article, Journal Name: IEEE Transactions on Applied Superconductivity: Journal vol. 19; Journal Issue: 3. (Abstract).
Barnes P.N. et al. , "Low AC Loss Structures in YBCO Coated Conductors with Filamentary Current Sharing", IEEE Transactions on Applied Superconductivity 15 (2):2827-2830(2005).
Cantoni C. et al., "Deposition and Characterization of $YBa_2Cu_3O_{7-\delta}/LaMnO_3$ /MgO/TiN Heterostructures on Cu Metal Substrates for Development of Coated Conductors", J. Mater. Res 18 (10):2387-2400 (2003).
Däumling M. et al, "AC Loss in Superconducting Power Cables", Studies of High Temperature Superconductors vol. 33:pp. 73 (1-39) (2000).
Fukaya K. et al., "Analysis of Precursors for Crystal Growth of YBaCuO Thin Films in Magnetron Sputtering Deposition", Thin Solid Films 517:2762-2766 (2009).
Gömöry F. et al., "The Influence of Filament Arrangement on Current Distribution and AC Loss in Bi-2223/Ag Tapes", Superconductor Science and Technology 17:S150-S154 (2004).
Inada R., "Feature Article: Advancement in Superconducting Material Technology-Advancements in Low AC Loss Technology of Bi-2223 Wire.", Superconductivity Web 21, Jul. 15, 2008, published by International Superconductivity Technology Center, Tokyo, Japan.
J. Mater., An evaluation of phase separated, self-assembled $LaMnO_3$-MgO nanocomposite films directly on IBAD-MgO as buffer layers for flux pinning enhancements in $YBa_2Cu_3O_{7-d}$ coated conductors, http://www.mrs.org/s_mrs/sce_subscribe.asp?CID=25547&DID=30, (Abstract), Mar. 2010.
Kim H.S. et al., "Deposition of $LaMnO_3$ Buffer Layer on IBAD-MgO Template by Reactive DC Sputtering", Physica C 469:1554-1558 (2009).
Lebedev O.I, et al., "Structural Phase Transitions and Stress Accommodation in $(La_{0.67}Ca_{0.33}MnO_3)_{1-x}$: $(MgO)_x$ Composite Films", Physical Review B 66:104421-1-104421-10 (2002).
Malozemoff A.P. et al "AC Losses in BSCCO Wires", Chinese Journal of Physics 34(2-II):222-231 (1996).
O.Polat.et al. Enhanced Flux Pinning in YBCO Films via Defects Created by Mixed Phase Substrate Cap Layers. Functionalize LMO cap layer to serve as a simplified template for the epitaxial growth as well as enhanced performance of YBCO films, 2008.
Paranthaman M.P. et al., "Growth of YBCO Films on MgO-Based Rolling-Assisted Biaxially Textured Substrates Templates", Superconductor Science and Technology 18:223-228 (2005).
Paranthaman, M. et al., "Growth of Thick $YBa_2Cu_3O_{7-\delta}$ Films Carrying a Critical Current of Over 230 A/cm on Single $LaMnO_3$-Buffered Ion-Beam Assisted Deposition MgO Substrates", J. Mater. Res. 18(9):2055-2059 (2003).
Polat O. et al., "Direct Growth of $LaMnO_3$ Cap Buffer Layers on Ion-Beam-Assisted Deposition MgO for Simplified Template-Based $YBa_2Cu_3O_{7-\delta}$-Coated Conductors", J. Mater. Res. 23(11):3021-3028 (2008).
Polat O. et al., Materials Research Society Spring Meeting 2009, Symposium CC: Nanoscale Functionalization and New Discoveries in Modern Superconductivity, Presentation No. CC3.8, San Francisco, Apr. 5, 2009.
Processing and characterization of $LaMnO_3$_ buffered layer on IBAD-MgO template vol. 468, Issues 15-20, Sep. 15, 2008, pp. 1597-1600. http://www.sciencedirect.com/science? obArticle URL&$_{13}$=B6T. (Abstract).
Saseha, Kreiskott., Reel to Reel Preparation of Ion-Beam Assisted Deposition (IBAD)-MgO Based Coated Conductors. http://www.mrs.org/s_mrs/sec_subscribe.asp?CID=2646&DID=116. (Abstract), Fall 2002.
Science Direct-Fabrication of highly textured IBAD-MgO template by continuous reel-to-reel process and its characterization; vols. 463-465, Oct. 1, 2007, pp. 564-567. (Abstract).
Venkataraman K. et al. "Growth of Lanthanum Manganate Buffer Layers for Coated Conductors Via a Metal-Organic Decomposition Process", IEEE Transactions on Applied Superconductivity 15(2):3005-3008 (2005).
Vladimir. Matias.et al., YBCO films grown by reactive co-evaporation on simplified IBAD-MgO coated conductor templates. vol. 23, No. 1. ( Abstract), Dec. 9, 2009.
Wasa K. et al., *Handbook of Sputter Deposition Technology , Principles, Technology and Applications*, Noyed Publications, Westwood, NJ, © 1992 (pp. 97-257).
Wee, S.H. et al. "Phase Separated, Epitaxial, Nanostructured $LaMnO_3$+MgO Composite Cap Layer Films for Propagation of Pinning Defects in $YBa_2Cu_3O_{7-\delta}$ Coated Conductors," Applied Physics Express 2(2009):063008(Jap Soc App Phys), publication date: Jun. 12, 2009.
Xiong X. et al., "Progress in High Throughput Processing of Long Length, High Quality and Low Cost IBAD MgO Buffer Tape at SuperPower", Applied Superconductivity Conference 2008, Chicago, IL, Aug. 18-22, 2008.
Zheng, H. et al. "Multiferroic $BaTiO_3$-$CoFe_2O_4$ Nanostructures,"Science 303(2004):661-3, publication date Jan. 30, 2004.

* cited by examiner

PHASE-SEPARATED, EPITAXIAL COMPOSITE CAP LAYERS FOR ELECTRONIC DEVICE APPLICATIONS AND METHOD OF MAKING THE SAME

CROSS-REFERENCE TO RELATED APPLICATIONS

This application is a continuation-in-part of U.S. patent application Ser. No. 12/648,748, entitled "Method for Producing Microstructures Templates and Their Use in Providing Pinning Enhancements in Superconducting Films Deposited Thereon," filed Dec. 29, 2009, the entirety of which is incorporated by reference herein.

STATEMENT REGARDING GOVERNMENT SPONSORSHIP

This invention was made with government support under Contract Number DE-AC05-00OR22725 between the United States Department of Energy and UT-Battelle, LLC. The U.S. government has certain rights in this invention.

FIELD OF THE INVENTION

The present invention relates to phase-separated, epitaxial composite cap layers for electronic device applications and methods of making the same.

BACKGROUND OF THE INVENTION

Methods for the preparation of films of high temperature superconductor (HTS) materials on various substrates are well known. These methods have been instrumental for converting HTS materials into tapes and wires, a necessary step in the effort for integrating these materials as wiring into conventional electrical grid systems and devices. Several companies produce HTS wires and tapes of various lengths.

The first HTS tapes suffered from unacceptably low critical current densities, a problem caused by poor alignment of grains in the HTS film or coating with grains of the substrate. Several techniques have therefore been developed to fabricate wires or tapes wherein grain alignment is produced. Of particular note is epitaxial growth of superconductors on such ordered substrates as the Rolling-Assisted-Biaxially-Textured-Substrates (RABiTS). RABiTS substrates typically include a textured metal underlayer (for example, nickel or nickel alloy) and an epitaxial buffer layer (for example, $Y_2O_3$ and/or yttria-stabilized zirconia, YSZ). The development, preparation, and application of RABiTS is disclosed in several references and patents, including, for example, U.S. Pat. Nos. 7,087,113, 5,739,086, 5,741,377, 5,898,020, 5,958,599, and 5,944,966, Epitaxial superconductors on biaxially-textured substrates have significantly improved critical current densities of HTS tapes, and thus, improved suitability for commercial applications.

However, a well-known problem of HTS tapes and wires to which much research has been directed is the dissipation in critical current density (typically expressed as $J_c$) of the superconductor film when the superconductor film is exposed to an external magnetic field. Since external magnetic fields (typically as high as 5 Tesla, or higher) are prevalent in most commercial and industrial applications, there has been a significant effort in incorporating design features into the superconductor film that mitigate these current density losses. One particularly promising method has been to introduce structural defects (i.e., pinning defects) into the superconductor film. The pinning defects have been found to significantly reduce current density losses in superconductor films in the presence of an external magnetic field.

Though physical methods (e.g., by laser scribing or photolithographic patterning) and chemical doping (e.g., with $BaZrO_3$) have been utilized to introduce pinning defects into the superconductor film, recent research has focused on introducing such defects into superconducting films by growing superconducting films epitaxially on substrates possessing microstructural defects (e.g., phase-separated components). However, the common techniques currently capable of producing such phase-separated substrates (e.g., physical vapor deposition (PVD), metal organic deposition, pulsed laser deposition (PLD), molecular beam epitaxy (MBE), chemical vapor deposition (CVD), metal-organic chemical vapor deposition (MOCVD) and atomic layer deposition (ALD)), possess the significant drawbacks of being non-scalable, cost prohibitive, and industrially inefficient (i.e., typically of low throughput).

There is a need for a method capable of producing epitaxial layers of phase-separated substrates in a high-throughput manner and within the time and cost constraints that would make the method feasible for use on an industrial scale. The method would preferably be integratable with current HTS tape production methods. By producing improved HTS tapes and wires cost-effectively on a large scale, such a method could hasten the adoption of superconducting wiring in a variety of applications, and make a superconducting wiring infrastructure more realizable and achievable.

SUMMARY OF THE INVENTION

An electronic component that includes a substrate and a phase-separated layer supported on the substrate is described. The phase-separated layer can include a first phase comprising lanthanum manganate (LMO), and a second phase selected from the group consisting of a metal oxide (MO), metal nitride (MN), a metal (Me), and combinations thereof. As used herein, MO, MN and Me have the following meanings:

MO=$Al_2O_3$, $Ba_xNb_yO_z$, $Ba_xTa_yO_z$, $Ba_xSn_yO_z$, $Ba_xAl_yO_z$, ZnO, $BiFeO_3$, $BaTiO_3$, $La_xTa_yO_z$, $La_xNb_yO_z$, $LaAlO_3$;

MN=TiN, ZrN, YN, VN, WN, GaN, AlN, HfN, TaN, NbN, InN, $Si_3N_4$, $Zn_3N_2$; and Me=Pd, Ta, Zr, Ti, Ir, Hf, Pt, Au, Ni, Zn, Mg, Cu, Al.

The first phase can be a continuous phase and the second phase can be a discontinuous phase. The weight ratio of the first phase to the second phase can range from 1:99 to 99:1. An upper surface of the phase-separated layer can include interfaces between the first phase and the second phase. The shape of the interfaces can be a shape selected from the group consisting of circular, rectangular, hexagonal and polyhedral. The phase-separated layer can be supported on a buffer layer that has a composition selected from the group consisting of IBAD MgO, LMO/IBAD-MgO, homoepi-IBAD MgO and LMO/homoepi-MgO. In addition, an electronically active layer can be supported on the phase-separated layer. The electronically active layer can be selected from the group consisting of a superconducting material, a ferroelectric material, a multiferroic material, a magnetic material, a photovoltaic material, a electrical storage material, and a semiconductor material.

The buffer layer can be a biaxially-textured layer and the phase-separated layer can be deposited on the biaxially-textured buffer layer. The phase-separated layer can be an epitaxial layer deposited on the biaxially-textured buffer layer. The electronic component can also include a superconductor layer supported on the biaxially-textured phase-separated layer. The superconductor layer can be an epitaxial layer.

A method of making the electronic component is also described. The method can include providing a substrate and forming the phase-separated layer supported on the substrate. The phase separated material can include a first phase comprising lanthanum manganate (LMO), and a second phase selected from the group consisting of a metal oxide (MO), metal nitride (MN), a metal (Me) and combinations thereof.

The forming step can include providing a first material for forming that first phase, and a second material for forming the second phase. The forming step can also include depositing the phase-separated layer by a technique selected from the group consisting of sputtering, pulsed laser deposition, e-beam evaporating, metal organic chemical vapor deposition, and metal organic deposition.

The method can also include (i) forming an electronically active layer supported on the phase-separated layer and/or (ii) annealing the phase-separated layer.

The method can also include forming a buffer layer supported on the substrate. Where the buffer layer is formed, the buffer layer can have a composition selected from the group consisting of IBAD MgO, LMO/IBAD-MgO, homoepi-IBAD MgO and LMO/homoepi-MgO, and the phase-separated layer can be supported on the buffer layer.

These and other embodiments are described in more detail below.

BRIEF DESCRIPTION OF THE DRAWINGS

A fuller understanding of the present invention and the features and benefits thereof will be obtained upon review of the following detailed description together with the accompanying drawings, in which:

FIGS. 1A and B are schematics showing layered electronic components according to the invention.

FIGS. 3A and B are the Z-contrast scanning transmission electron microscopy image of LMO:$Al_2O_3$/LMO/homo-epi MgO/IBAD-MgO, and high magnification image of LMO:$Al_2O_3$ composite layer, respectively.

DETAILED DESCRIPTION OF THE INVENTION

Phase-separated, epitaxial composite cap layers for electronic device application and methods of making the same are described. The inventors have discovered that phase-separated cap layers can produce electronic devices with improved properties. For example, defects in the phase-separated cap layer can serve as nucleation sites that produce similar phase-separations, e.g., defects, in electronically active layers, such as superconducting layers, deposited on the phase-separated cap layer. The defects that are transmitted to the superconductor layer can help prevent reductions in critical current density from resulting when a magnetic field is present during operation of a superconductor device. These and other benefits of the phase-separated cap layers described herein are set forth below.

The invention can be an electronic component 10 that includes a substrate 12 and a phase-separated layer 14 supported on the substrate 12. Examples of suitable materials for the substrate include, but are not limited to, a single crystal substrate; a biaxially textured substrate; and an untextured substrate having adhered thereon a biaxially-textured crystallographic surface, such as an ion-beam assisted deposition (IBAD) substrate.

The phase-separated layer 14 can be a cap layer and can include a first phase comprising lanthanum manganate (LMO), and a second phase selected from the group consisting of a metal oxide (MO), metal nitride (MN), a metal (Me), and combinations thereof. The metal oxides of interest include $Al_2O_3$, $Ba_xNb_yO_z$, $Ba_xTa_yO_z$, $Ba_xSn_yO_z$, $Ba_xAl_yO_z$, ZnO, $BiFeO_3$, $BaTiO_3$, $La_xTa_yO_z$, $La_xNb_yO_z$, $LaAlO_3$, and combination thereof. The metal nitrides of interest include TiN, ZrN, YN, VN, WN, GaN, AlN, HfN, TaN, NbN, InN, $Si_3N_4$, $Zn_3N_2$, and combinations thereof. The metals of interest include Pd, Ta, Zr, Ti, Ir, Hf, Pt, Au, Ni, Zn, Mg, Cu, Al, and combinations thereof.

The phase-separated layer 14 can include additional components or can be free from any additional components. For example, the phase-separated layer can include LMO, a metal oxide and a metal nitride. Alternately, the phase-separated layer can include LMO, a metal oxide and a dopant, e.g., silicon. Where the phase-separated layer includes a dopant, the dopant can be different or be present in a different concentration in each of the first and the second phases.

The LMO in the phase-separated layer can be present in an amount ranging from 0.5 to 99.5 wt-%, 5 to 95 wt-%, or 10 to 90 wt-% based on the total weight of LMO, MO, MN and Me in the phase-separated layer. The LMO in the phase-separated layer can be present in an amount of at least 10 wt-%, at least 20 wt-%, at least 30 wt-%, at least 40 wt-%, at least 50 wt-%, at least 60 wt-%, at least 70 wt-% or at least 80 wt-% based on the total weight of LMO, MO, MN and Me in the phase-separated layer. The MO, MN and/or Me in the phase-separated layer can be present in an amount ranging from 0.5 to 99.5 wt-%, or 1 to 97.5 wt-%, or 2 to 95 wt-%, or 3 to 92.5 wt-%, or 4 to 90 wt-%, all based on the total weight of LMO, MO, MN and Me in the phase-separated layer. The MO, MN and/or Me in the phase-separated layer can be present in an amount of 80 wt-% or less, 70 wt-% or less, 60 wt-% or less, 50 wt-% or less, 40 wt-% or less, 30 wt-% or less, 20 wt-% or less, 15 wt-% or less, 10 wt-% or less, or 5% wt-% or less based on the total weight of LMO, MO, MN and Me in the phase-separated layer.

The phase-separated layer 14 can be supported on a buffer layer 16. Exemplary buffer layers 16 can have a composition selected from the group consisting of IBAD MgO, LMO/IBAD-MgO, homoepi-IBAD MgO, LMO/homoepi-MgO, $CeO_2$/IBAD-$Gd_2Zr_2O_7$, $CeO_2$/LMO/IBAD-MgO, $CeO_2$/LMO/homoepi-MgO, $Sm_xZr_{1-x}O_y$/IBAD-MgO, $SrTiO_3$/homoepi-MgO/IBAD-MgO, $SrRuO_3$/homoepi-MgO/IBAD-MgO, $CeO_2$/IBAD-YSZ, IBAD-TiN, $CeO_2$/$REMnO_3$/IBAD-MgO, $REMnO_3$/IBAD-MgO (RE=Rare Earth). The buffer layer 16 can be a textured layer, such as a biaxially textured layer, and the phase-separated layer 14 can be deposited on the buffer layer 16. The phase-separated layer 14 can be an epitaxial layer, e.g., a homepitaxial layer or a heteroepitaxial layer. However, it should be understood that the phase-separated layer 14 and the buffer layer 16 are not necessarily biaxially textured or textured at all.

As used herein, "biaxially textured" refers to materials having crystallographic orientations both parallel and perpendicular to the basal plane of a material, e.g., {100}<100>, including texture aligned along a first axis along the [001] crystal direction, and along a second axis having a crystal direction selected from the group consisting of [111], [101], [113], [100], and [010]. The degree of biaxial texture in the layer of which the biaxially textured surface 14, as specified by the FWHM of the out-of-plane and in-plane diffraction peak, is typically greater than 2° and less than 20°, preferably less than 15°, and optimally less than 10°. Furthermore, the biaxially-textured substrate need not be polycrystalline (i.e., multi-grained), but may be single-crystalline (i.e., single-grained).

As used herein, a first layer is "supported" on a second layer if the first layer is part of the same composite and is located above the second layer. As used herein, a first layer is "deposited" on a second layer if the first layer is above and in contact with the second layer. Thus, where a first layer is "supported" on a second layer, it is intended to encompass embodiments where the first layer is deposited on the second layer.

The first phase 22 can be a continuous phase or a discontinuous phase and the second phase 24 can be a continuous phase or a discontinuous phase. In some exemplary phase-separated layers, the first phase can be continuous, while the second phase is discontinuous.

The second phase 24 can be embedded or partially embedded in the first phase 22. The second phase can be present in the form of nanostructures, such as nanorods, nanodots, nanowires, and combinations thereof. The nanostructures can be discontinuous, but present in an ordered array within the first phase.

Figure 3:
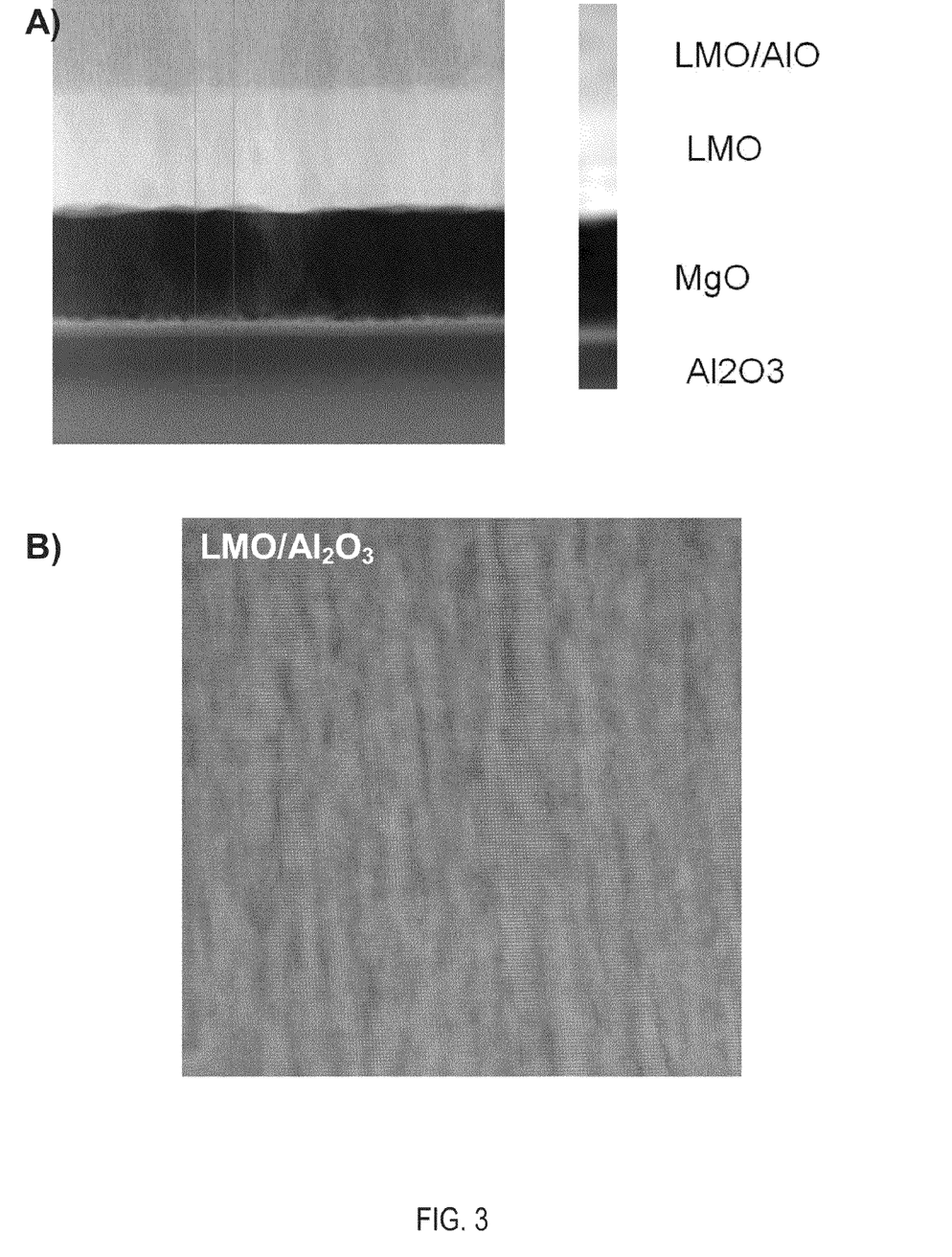

For example, FIGS. 3A and 3B shown an embodiment where the second phase is present as a plurality of nanodots (light colored dots) that are embedded or partially embedded in a continuous first phase of LMO. In FIGS. 3A and 3B, the nanodots are $Al_2O_3$.

The concentration of the nanostructures (i.e., nanorods, nanocolumns, nanodots and nanowires) in the phase-separated layer 14 can vary. In one aspect, the number density of second phase nanostructures can be between 400 and $4\times10^4$ per $\mu m^2$, which corresponds to interspacing distance between adjacent defects in the range of 5 to 50 nm in the phase-separated layer.

The thickness (e.g., width or largest dimension) of the nanostructures in the phase-separated layer can generally be of nanoscale dimensions, i.e., less than 1 μm thick. For example, in different embodiments, the largest dimension of the nanostructures can be less than 500 nm, or less than 200 nm, or less than 100, 90, 80, 70, 60, 50, 40, 30, 20, or less than 10 nm. The smallest dimension of the nanostructures can be greater than 1, 2, 3, 4, 5, 10, 20, 30, 40 or 50 nm. The nanostructures can also have any combination of the aforesaid largest dimensions and smallest dimensions. However, smaller or larger thicknesses of the nanorod features are also possible. More typically, the largest dimension of the nanostructures is in the range of 1-100 nm.

The diameter of the nanodots can be between 1 nm and 100 nm. The diameter of the nanodots will depend on the type of processes and processing conditions. In the case of columnar nanostructures, the length of the columns can be up to the entire film thickness of the phase-separate layer. The length will depend on the type of processes and processing conditions. The width of the nanorods or nanocolumns can be between 1 nm and 100 nm. The width of the nanorods or nanocolumns will depend on the type of processes and processing conditions.

The nanodots can have an average diameter of 6-7 nm which is consistent with the estimation by XRD and can be separated by a distance of 15-20 nm from each other.

The weight ratio of the first phase to the second phase ranges from 1:99 to 99:1. In other exemplary phase-separated materials, the weight ratio of the first phase to the second phase can range from 2:98 to 98:2, or from 70:30 to 30:70, or from 80:20 to 20:80, or from 90:10 to 10:90. The weight ratio of the first phase to the second phase can be 2:1 or greater, or 3:1 or greater, or 4:1 or greater, or 7:1 or greater, or 9:1 or greater, or 19:1 or greater.

Figure 5:
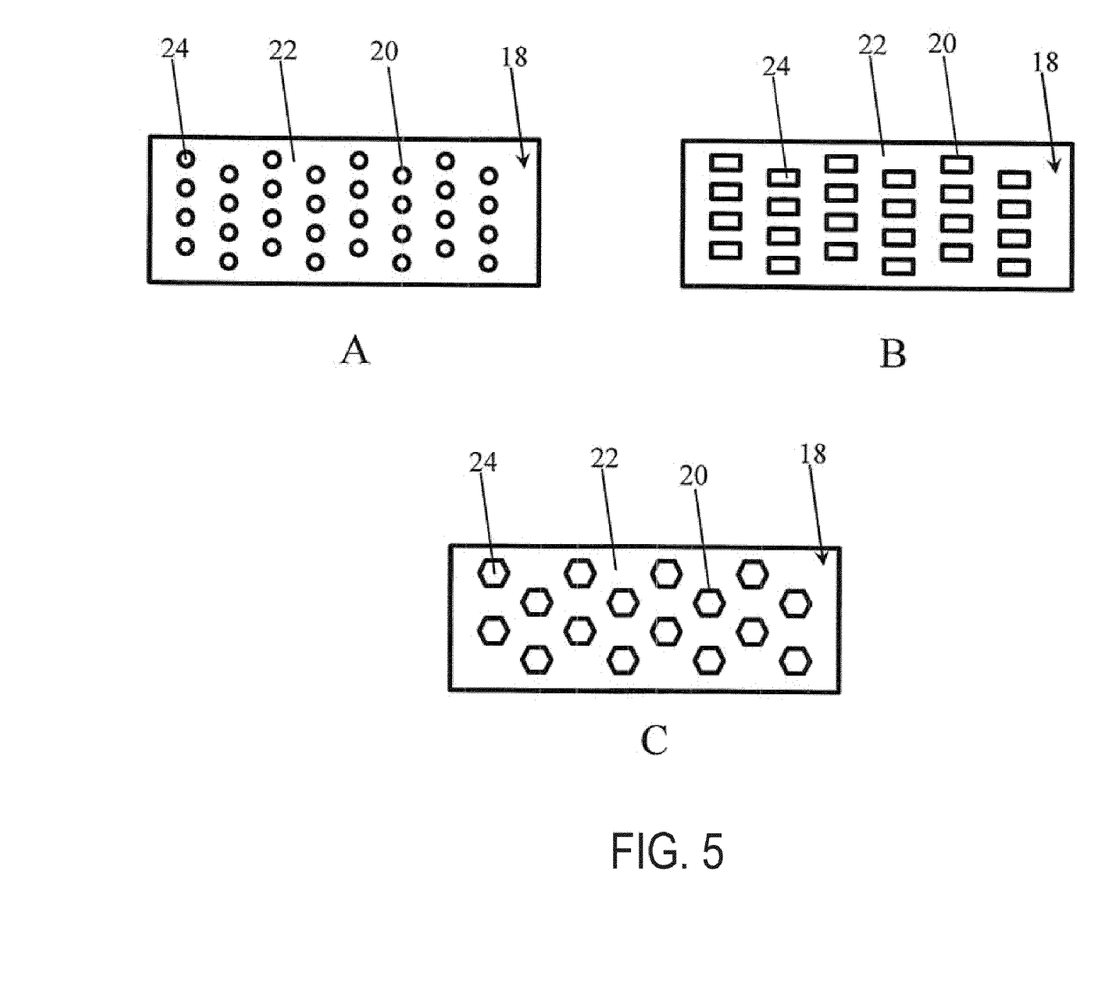
FIGS. 5A-C are top view schematics of several exemplary phase-separated layers according to the invention.

As shown in FIGS. 5A-C, an upper surface 18 of the phase-separated layer 14 can include interfaces 20 between the first phase 22 and the second phase 24. As shown in FIG. 5A-C, the shape of the interfaces can be selected from the group consisting of circular (FIG. 5A), square, triangular, rectangular (FIG. 5B), hexagonal (FIG. 5C) and other regular or irregular polyhedrals. It should be noted that, except for photographs, the Figures included as part of the detailed description are not drawn to scale and are provided for purposes of illustration only.

The electronic component 10 can also include an electronically active layer 26 supported on or deposited on the phase-separated layer 14. The electronically active layer 26 can be selected from the group consisting of a superconducting material, a ferroelectric material, a multiferroic material, a magnetic material, a photovoltaic material, an electrical energy storage material, a dielectric material, and a semiconductor material. As used herein, electrical storage material is intended to include any electrical storage material including, but not limited to, battery and capacitors layers or layered structures.

In some exemplary electronic components 10, the device layer 26 can be a superconductor material. In such electronic components 10, it can be beneficial for the buffer layer 16, the phase-separated layer 14 or both 14, 16 to be biaxially textured. Similarly, where the device layer 26 is a superconductor material, the device layer 26 can be biaxially textured, can be epitaxial and can be deposited on the phase-separated layer 14.

Figure 4:
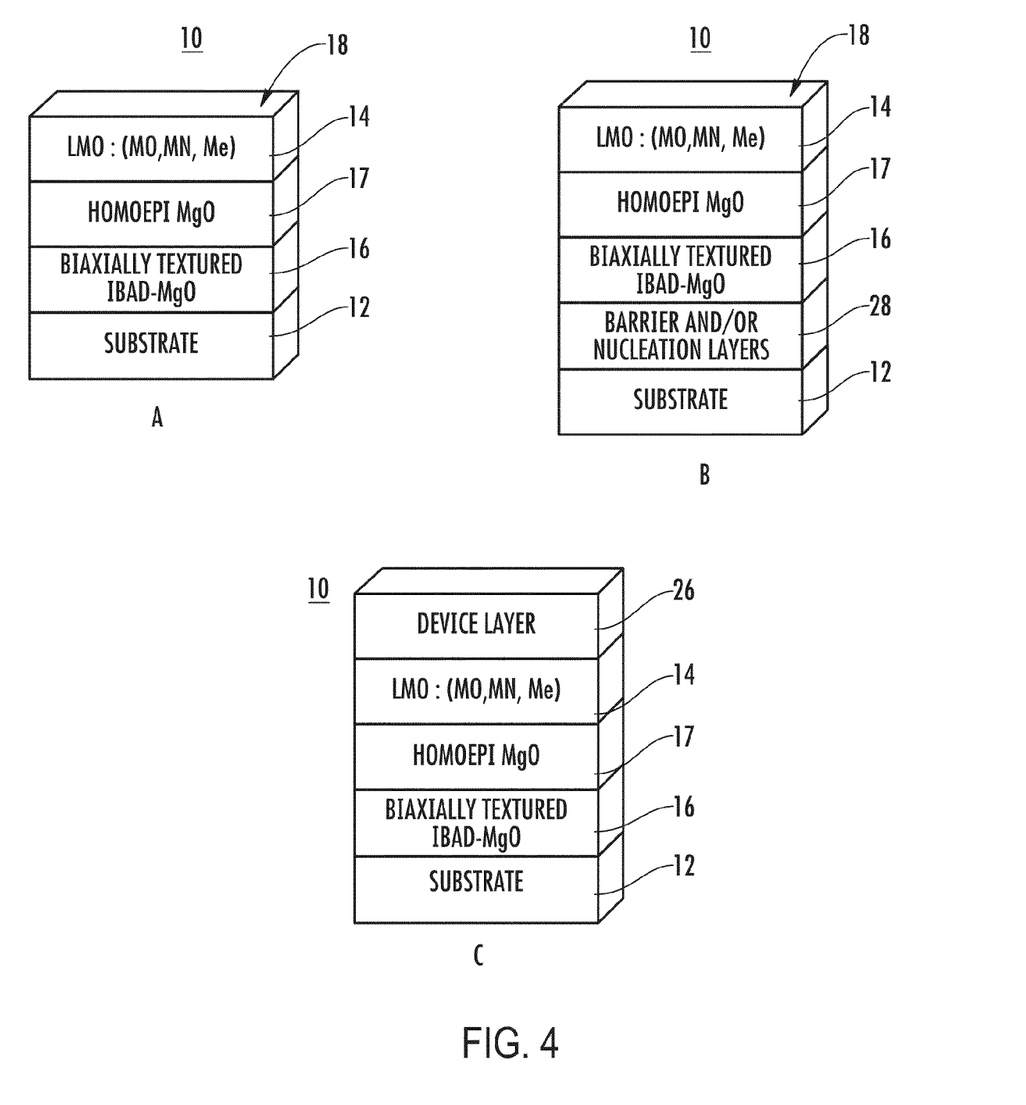
FIGS. 4A-C are schematics showing layered electronic components according to the invention.

FIGS. 4A-C, show a variety of exemplary electronic components 10. FIG. 4A is a diagram of an electronic component 10 that includes a substrate 12 with a first buffer layer 16, e.g., biaxially textured IBAD MgO, deposited on the substrate 12; a second buffer layer 17, e.g., homoepitaxial MgO, deposited on the first buffer layer 16; and a phase-separated layer 14 deposited on the second buffer layer 17. FIG. 4B is similar to FIG. 4A with the modification that the first buffer layer 16 is deposited on a barrier and/or nucleation layer 28, which is deposited on the substrate 12. Finally, FIG. 4C is similar to FIG. 4A with the modification that a device layer 26, such as a superconductor material, is deposited on the phase separated layer 14. It should be understood that the buffer layers 16, 17 and phase-separated layer 14 need not be biaxially textured for most applications other than where the device layer 26 is a superconductor layer.

A method of making the electronic component 10 described herein is also described. The method can include providing a substrate and forming a phase-separated layer supported on the substrate. The phase-separated layer can include a first phase comprising lanthanum manganate (LMO), and a second phase selected from the group consisting of a metal oxide (MO), metal nitride (MN), a metal (Me), and combinations thereof. The metal oxide can be selected from $Al_2O_3$, $Ba_xNb_yO_z$, $Ba_xTa_yO_z$, $Ba_xSn_yO_z$, $Ba_xAl_yO_z$, ZnO, $BiFeO_3$, $BaTiO_3$, $La_xTa_yO_z$, $La_xNb_yO_z$, $LaAlO_3$, and combinations thereof. The metal nitride can be selected from TiN, ZrN, YN, VN, WN, GaN, AlN, HfN, TaN, NbN, InN, $Si_3N_4$, $Zn_3N_2$, and combinations thereof. The metal can be selected from Pd, Ta, Zr, Ti, Ir, Hf, Pt, Au, Ni, Zn, Mg, Cu, Al, and combinations thereof.

The forming step can include providing a first material for forming the first phase, and a second material for forming the second phase. The forming step can also include depositing the phase-separated layer by a technique selected from the group consisting of sputtering, pulsed laser deposition, e-beam evaporating, metal organic chemical vapor deposition, and metal organic deposition.

The method can also include forming an electronically active layer 26 supported on or deposited on the phase-separated layer 14. After the phase-separated layer is formed, the method can include annealing the phase-separated layer. The annealing step can be of a sufficient temperature and duration to facilitate separation of the first and second phases.

The method can also include forming a buffer layer 16 supported on the substrate 12 and forming the phase-separated layer 14 supported on the buffer layer 16. The buffer layer(s) 16 and/or 17 can include a composition selected from the group consisting of IBAD MgO, LMO/IBAD-MgO, homoepi-IBAD MgO and LMO/homoepi-MgO.

The phase-separated layer 14 can be useful for producing superconductor device layers 26 that are flux pinning substrates. The term "flux pinning substrate", as used herein, refers to a substrate, which, by virtue of phase-separated portions therein, can introduce flux pinning defects into a superconducting film 26 that is deposited onto (i.e., grown on) the phase-separated layer 14.

The method for producing the phase-separated layer 14 can involves subjecting a target material (which contains two or more target components) to a sputtering technique (or other deposition technique disclosed herein) to form a phase-separated layer 14 supported on a substrate 12. The target material should include LMO and at least one of MO, MN or Me, or a precursor thereof. In addition, the deposition technique should be operated under conditions appropriate for deposition of phase-separated material. The characteristic of becoming phase-separated can be, for example, an inherent characteristic of the components (i.e., a propensity to phase-separate), or alternatively, a result of annealing or a reaction or interaction of the components with each other or another agent.

The phase-separated layer 14 can be characterized by containing regions of different compositions, or more broadly, regions having different lattice structures, i.e., regions that are crystallographically dissimilar or mismatched. Regions of different compositions will necessarily possess different lattice structures. Where an electronically active layer 26 is supported by the phase-separated layer 14, the boundaries 20 between the different phases 22, 24 can serve to transmit (i.e., propagate) defects, e.g., flux-pinning defects, into the electronically active layer 26. Flux-pinning defects in the superconducting film typically result from crystallographically-mismatched and/or lattice-mismatched regions introduced into the superconducting film by the phase-separated layer.

Preferably, the crystallographically-mismatched and/or lattice-mismatched regions in the phase-separated layer have an ordered arrangement with respect to each other. The degree of order possessed by the phase-separated layer is preferably of the degree found in highly ordered self-assembled structures. For example, the order is preferably characterized by fixed or patterned distances (i.e., interspaces) between crystallographically matching (or same-composition) regions, such as would be found in self-assembled (e.g., interdigitated or periodic) ordered materials. When the distances are fixed, the distances between crystallographically matching regions are constant throughout the phase-separated layer. When the distances are patterned, the distances between at least a portion of the crystallographically matching regions are different, but follow a repeating pattern throughout the phase-separated layer.

In one embodiment, the fixed or patterned distances between nanostructures in the phase-separated layer 14 are on the nanoscale, such as a distance of about or no more than 1 nm, 2 nm, 3 nm, 4 nm, 5 nm, 10 nm, 20 nm, 30 nm, 40 nm, 50 nm, 60 nm, 70 nm, 80 nm, 90 nm, 100 nm, 150 nm, 200 nm, 250 nm, 300 nm, 350 nm, 400 nm, 450 nm, 500 nm, 550 nm, 600 nm, 650 nm, 700 nm, 750 nm, 800 µm, 850 µm, 900 nm, or 950 nm, or a distance within a particular range bounded by any two of the foregoing values. In another embodiment, the fixed or patterned distances between nanostructures in the phase-separated layer 14 are on the microscale, such as a distance of about or no more than 1 µm, 2 µm, 3 µm, 4 µm, 5 µm, 10 µm, 20 µm, 30 µm, 40 µm, 50 µm, 60 µm, 70 µm, 80 µm, 90 µm, 100 µm, 125 µm, 150 µm, 175 µm, 200 µm, 225 µm, or 250 µm, or a distance within a particular range bounded by any two of the foregoing values. In another embodiment, a portion of the fixed or patterned distances is within the nanoscale range while another portion of the fixed or patterned distances is within the microscale range.

Because the defects from the phase-separated layer 14 will propagate to electronically active layers 26 deposited thereon, the electronically active layers 26 generally includes similar nanostructures on the basis of crystallographic mismatches, rather than the differences in composition present in the phase-separated layer 14. Thus, the nanostructures present in the electronically active layers 26 can have any of the dimensions described herein for the nanostructures for the phase-separated layer 14.

The crystallographically mismatched and/or lattice mismatched regions in the phase-separated layer 14 can have any particular shape. For example, in different embodiments, at least one of the groups of phase-separated regions are substantially spherical (e.g., globules), or columnar (e.g., filamentous), or plate-like. In the particular case of columnar structures, the columnar structures can be, for example, a cylindrical, square, rectangular, or triangular columnar structure, or a polygonal columnar structure (e.g., pentagonal, hexagonal, or other polygonal columnar shape). Furthermore, a cylindrical columnar shape includes ovoid or flattened cylindrical shapes.

Though any arrangement is considered herein, for the purpose of transmitting defects into the electronically active layer deposited or supported thereon, it is necessary that the surface 18 of the phase-separated layer 14 on which the subsequent epitaxial layer, e.g., the electronically active layer 26 is deposited has a phase-separated surface. In particular, it must be noted that the defects will not transfer if the surface is a single phase, even though phase-separated regions are present below the surface.

In some exemplary electronic components, the phase-separated layer can be characterized by the presence of columnar or platelike phase-separated regions having their vertical axes (i.e., length-wise or longest axes, as opposed to shorter width-wise axes) oriented non-parallel to the ordered surface of the primary substrate and/or to the surface of the phase-separated layer, wherein the ends of the columnar or platelike phase-separated regions form a portion of the surface of the phase-separated layer.

Preferably, the vertical axes of the columnar or platelike regions are substantially or precisely perpendicular to the primary substrate and/or the surface of the phase-separated layer. Alternately, the phase-separated layer can be characterized by the presence of columnar or platelike phase-separated regions having their vertical axes oriented substantially or precisely parallel to the ordered surface of the primary substrate and/or to the surface of the phase-separated layer. In the later case, the surface of the phase-separated layer on which the superconducting film will be deposited is striated by the lengthwise portions of the columnar or platelike structures.

The components in the target material need not be of equivalent chemical structure to the components in the phase-separated layer. For example, the target components may react with each other or the primary substrate or with a gaseous reactive component during the deposition procedure to form a new phase-separated component in the deposited layer.

Each of the target components in the target material is necessarily present in a weight, volume, or molar percentage of less than 100% with respect to the total weight of target material. For example, in different embodiments, the percentage of one component, e.g., LMO, MO, MN or Me, can be about, or less than, or greater than 99%, 98%, 95%, 90%, 85%, 80%, 75%, 70%, 65%, 60%, 55%, 50%, 45%, 40%, 35%, 30%, 25%, 20%, 15%, 10%, 5%, 2%, or 1%, or within a range bounded by any two of the foregoing percentages. In the case where strictly two target components are used, the amount of first target material can be represented as "A" while the amount of the second target material can be represented as "100-A". In the case where three target components are used, the amount of the first and second target components can be represented as "A" and "B", respectively, while the amount of the third target material can be represented as "100-A-B" (and so on, for additional target components). By adjustment of the percentage of components in the target material, an adjustment can be made in the percentage of one component with respect to another component in the deposited film. Accordingly, the spacing between nanostructures in the phase-separated layer and the epitaxial layers deposited thereon can also be adjusted.

The two or more target components can be in a mixed or separated state during the deposition process, e.g., a sputtering process. In the mixed state, the target components can be mixed to any suitable degree of homogeneity. For example, a mixture of target components can be finely mixed (e.g., variable regions can be evident only on the microscale, i.e., less than 1 micron, or nanoscale), or coarsely mixed (e.g., variable regions are evident on a size scale greater than 1, 10, 100, or 500 microns).

Adjustments in the density, distribution, or size of the nanostructures in the phase-separated layer can provide a desired modulation of defects in a film deposited thereon, e.g., a electronically active layer. These adjustments can be achieved by judicious selection or adjustment of the conditions used in the deposition technique. The corresponding modulation of defects in the phase-separated layer can include, for example, an adjustment of the density, distribution, interspacing, or columnar width, of or between defect features (including filaments) present in the superconducting film. Modulation of defects in the phase-separated film 14 can be used to form superconducting layers 26, for example, which exhibit optimized AC loss reduction, flux pinning, or the current density values. Alternately, a non-superconducting film can be deposited on the phase-separated layer.

As used herein, the "primary substrate" is the substrate upon which the phase-separated layer 14 is deposited. Where a biaxially textured phase-separated material is desired, the primary substrate can be any suitable layer that contains an ordered surface, as particularly known and used in the field of epitaxial tapes and films, e.g., superconductor or semiconductor tapes. The ordered surface is typically a result of molecular-level organization, such as found in a crystalline or polycrystalline surface. The primary substrate can be a biaxially-textured substrate, such as any of the biaxially-textured substrates known in the art or described herein.

Any of the biaxially-textured substrates known in the art can be used as the primary substrate, e.g., buffer layer, on which the phase-separated layer is deposited. The term "biaxially-textured substrate" as used herein is meant to be synonymous with the related term "sharply biaxially-textured substrate."

Several types of biaxially-textured substrates are known, all of which are suitable for the purposes described herein. Biaxially-textured substrates suitable for use herein is the class of rolling assisted, biaxially-textured substrates (RABiTS). The RABiTS method produces a polycrystalline substrate having primarily low angle grain boundaries. Further details of the RABiTS technique and formed substrates can be found in, for example, A. Goyal, et al., *J. of Materials Research*, vol. 12, pgs. 2924-2940, 1997, and D. Dimos et al., *Phys. Rev. B*, 41:4038-4049, 1990, the disclosures of which are incorporated herein by reference.

The RABiTS technique provides a simple method for fabricating long lengths of biaxially-textured substrates with primarily low-angle grain boundaries. These substrates have been widely employed for the epitaxial deposition of high temperature superconducting (HTS) materials. A number of U.S. patents directed to the RABiTS process and related process variants have been issued. These include U.S. Pat. Nos. 5,739,086; 5,741,377; 5,846,912; 5,898,020; 5,964,966; 5,958,599; 5,968,877; 6,077,344; 6,106,615; 6,114,287; 6,150,034; 6,156,376; 6,151,610; 6,159,610; 6,180,570; 6,235,402; 6,261,704; 6,270,908; 6,331,199; 6,375,768; 6,399,154; 6,451,450; 6,447,714; 6,440,211; 6,468,591; 6,486,100; 6,599,346; 6,602,313; 6,607,313; 6,607,838; 6,607,839; 6,610,413; 6,610,414; 6,635,097; 6,645,313; 6,537,689; 6,663,976; 6,670,308; 6,675,229; 6,716,795; 6,740,421; 6,764,770; 6,784,139; 6,790,253; 6,797,030; 6,846,344; 6,782,988; 6,890,369; 6,902,600; and 7,087,113, the disclosures of which are incorporated herein by reference in their entireties. Of particular relevance in the above list of patents are U.S. Pat. Nos. 7,087,113, 5,739,086, 5,741,377, 5,898,020, 5,958,599 and 5,944,966.

In a preferred embodiment, a RABiTS substrate can be prepared as follows. Briefly, a deformed metal substrate with a very well-developed copper-type (Cu-type) rolling texture is first provided. The metal can be any suitable metal, and typically a FCC type of metal (e.g., Cu, Co, Mo, Cd, Pd, Pt, Ag, Al, Ni, and their alloys), and more preferably, nickel and its alloys (e.g., NiW). A substrate with a Cu-type rolling texture can be readily identified, as known in the art, and as disclosed in, for example, U.S. Pat. No. 7,087,113. For example, a Cu-type rolling texture generally exhibits the characteristic that the X-ray intensity in the pole figures is concentrated on the β-fiber in Euler space of orientation representation. In other words, a Cu-type rolling texture is generally characterized by an orientation of all the grains in the material lying on the β-fiber. The β-fiber is defined as the tube or fiber running from the B through the S to the C point in Euler space. Cu-type rolling texture is generally best shown using pole figures of (111), (200), and (220) from the substrate or drawing the orientations in Euler Space. Next, the metal with Cu-type rolling texture is annealed at a temperature higher than its secondary recrystallization temperature to provide exaggerated grain growth such that a single grain consumes other grains to form an essentially single crystalline (i.e., single grain) type of material (hereinafter, a "single crystal substrate").

Typically, at least one buffer layer is epitaxially deposited on the surface of the single crystal substrate. The function of the buffer layer is typically as a chemical barrier between the single crystal substrate and the active (e.g., superconducting)

layer, thereby preventing reaction between these layers while epitaxially transmitting the ordered crystalline structure of the single crystal substrate to the superconducting layer. Exemplary buffer layers include, but are not limited to, $CeO_2$, yttria-stabilized zirconia (YSZ), $(RE)_2O_3$, wherein RE can be any of the metals already defined above (e.g., $Y_2O_3$), $LaM'O_3$, wherein M' is a transition or main group metal (e.g., $LaAlO_3$, $LaGaO_3$, $LaMnO_3$, $LaCrO_3$, $LaNiO_3$), lanthanum zirconate (e.g., $La_2Zr_2O_7$), $SrTiO_3$ (and its Nb-doped analog), $NdGaO_3$, $NbTiO_3$, MgO, TiN, $TiB_2$, Pd, Ag, Pt, and Au. Some common RABiTS architectures include, for example, a four-layer architecture, such as $CeO_2/YSZ/Y_2O_3/Ni/Ni$—W, and a three-layer architecture, such as $CeO_2/YSZ/CeO_2/Ni$—W.

Another type of biaxially-textured substrate includes the ion-beam-assisted deposition (IBAD) substrate. IBAD processes and resulting substrates are described in, for example, U.S. Pat. Nos. 6,632,539, 6,214,772, 5,650,378, 5,872,080, 5,432,151, 6,361,598, 5,872,080, 6,756,139, 6,884,527, 6,899,928, and 6,921,741, the disclosures of which are incorporated herein by reference in their entireties, Typically, an IBAD substrate is characterized by an MgO layer (i.e., "IBAD-MgO") biaxially grown using ion assist on an $Al_2O_3/Y_2O_3$-coated polycrystalline nickel-based alloy (generally, Hastelloy) base substrate. The Hastelloy substrate is typically deposited on a polycrystalline copper layer. The $Al_2O_3$ layer serves primarily as a barrier to prevent upward diffusion of substrate components (i.e., functions as a diffusion barrier layer) while the $Y_2O_3$ layer serves as a seed layer for the IBAD-MgO nucleation. Often, a homo-epitaxial MgO (i.e., homo-epi MgO) layer is epitaxially grown on the IBAD-MgO layer to improve the texture of the IBAD-MgO layer. A texture-transferring capping layer, typically a perovskite layer, such as $LaMnO_3$ (LMO), $SrRuO_3$, or $SrTiO_3$ (but, more typically, LMO) is deposited on the homo-epi MgO layer, or directly on the IBAD-MgO layer. The texture-transferring layer functions to transfer the texture of the MgO layer to the superconducting layer, i.e., wherein the superconducting layer is generally deposited on the capping perovskite layer. An exemplary and widely used IBAD architecture is $Al_2O_3/Y_2O_3$/IBAD-MgO/homo-epi MgO/LMO.

Yet another type of biaxially-textured substrate includes the inclined-substrate deposition (ISD) substrate. In the ISD process, the resulting substrate has rotated cube texture and the rotation can be as high as 40-45°. ISD processes and resulting substrates are described in, for example, U.S. Pat. Nos. 6,190,752 and 6,265,353, the disclosures of which are incorporated herein by reference in their entireties. In both the IBAD and ISD processes, a biaxially-textured layer is deposited on a flexible, polycrystalline, untextured substrate.

The primary substrate considered herein possesses an ordered (i.e., typically, biaxially-textured) surface upon which the phase-separated layer is deposited. The ordered surface can be, for example, any of the layers described above that are typically included in a biaxially textured primary substrate, such as found in a RABiTS, IBAD, or ISD) substrate. For example, the surface may be a crystalline or polycrystalline (e.g., epitaxial) layer of a metal oxide (e.g., $CeO_2$, $ZrO_2$, $Al_2O_3$, $Y_2O_3$, or YSZ), metal (e.g., Ni, Cu), or metal alloy (e.g., Ni—W). In a particular embodiment, the surface is a crystalline, polycrystalline, or epitaxial layer of an alkaline earth metal oxide, such as MgO.

Figure 1:
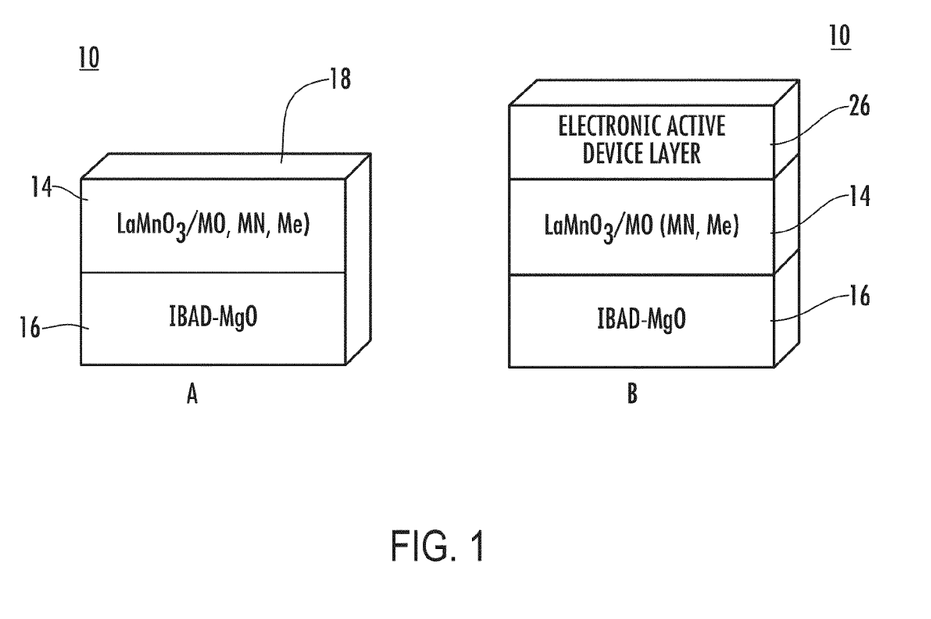

In an exemplary electronic component 10, such as those shown in FIGS. 1A-B, the phase-separated layer 14 can be deposited on an IBAD-MgO layer 16 of an IBAD primary substrate in the absence of a homo-epi MgO layer. In another exemplary embodiment, such as shown in FIGS. 4A-C, the phase-separated layer 14 is deposited on a homo-epi MgO layer 17 deposited on an IBAD-MgO layer 16. In another particular embodiment, the phase-separated layer is deposited directly on a Hastelloy substrate.

The primary substrate surface on which the phase-separable components are epitaxially deposited can influence an effect on the growth mechanisms of the phase-separated components. Accordingly, the primary substrate surface can be appropriately selected or modified in order to adjust, modulate, or optimize crystallographic and other morphological characteristics of the epitaxially-grown phase-separated layer.

Where sputtering is used, the sputtering deposition technique can be any of the deposition techniques known in the art in which a target material and substrate are made to assume opposite polarities within a reduced pressure atmosphere at a voltage difference sufficient to induce gas-phase sputtering of the target material, thereby resulting in the ejection of atoms of the target material and their deposition on the substrate. The invention incorporates by reference all of the knowledge in the art pertaining to the concept, design, and operation of sputtering techniques useful for deposition of a film onto a substrate, as treated by, for example, K. Wasa, S. Hayakawa, *Handbook of Sputter Deposition Technology, Principles, Technology and Applications*, Noyes Publications, (c) 1992, and *Glow Discharge Processes, Sputtering and Plasma Etching*, John Wiley & Sons, Inc., (c) 1980, of which the contents pertaining to sputtering deposition techniques are incorporated herein in their entirety.

As is well known in the art, a sputtering process operates by the general principle that the voltage established between the target material and substrate causes an acceleration of electrons, which, in turn, causes ionization of the gaseous medium (sputter gas) as the electrons collide with gas molecules. The resulting ionized gas molecules, which are positively charged, are made to accelerate toward the target material when the target material is held at a negative charge. The impact of the ionized gas molecules on the target material causes the ejection of atoms of the target material and their deposition onto the substrate.

Where sputtering is used, the sputtering deposition technique can be a direct current (DC) sputtering technique. In a DC sputtering system, the target material is typically oriented as the cathode (i.e., negatively charged) while the substrate is typically oriented as the anode (i.e., positively charged with respect to the cathode). Generally, in a DC sputtering system, the polarity applied to the target material and substrate is fixed (i.e., does not change or fluctuate) through the duration of the deposition. The applied voltage is generally at least about 100 volts (100 V) and up to about 5 kilovolts (5 kV). In different embodiments, the applied voltage may be about, at least, or no more than 100 V, 150 V, 200 V, 250 V, 300 V, 350 V, 400 V, 450 V, 500 V, 550 V, 600 V, 650 V, 700 V, 750 V, 800 V, 850 V, 900 V, 950 V, 1 kV, 1.5 kV, 2 kV, 2.5 kV, 3 kV, 3.5 kV, 4 kV, 4.5 kV, or 5 kV, or within a range bounded by any two of the foregoing values.

Alternately, the sputtering deposition technique can be a polarity-oscillating technique, such as a radiofrequency (RF) sputtering technique. In a polarity-oscillating technique, the voltage bias between target material and substrate is alternated at a particular frequency. The alternating polarity results in the alternating bombardment of the target by positively-charged ions and electrons. At least one advantage of the polarity-oscillating technique is that the alternate bombardment of the target by ions and electrons (as induced by the oscillating polarity) prevents the build-up of charge on the target, particularly on an insulating target. Another advantage of the polarity-oscillating technique is that lower operating pressures can be used as compared to DC sputtering techniques, primarily as a result of a more efficient use of the electron impact ionization. The polarity oscillation is typically in the radiofrequency range (i.e., for RF sputtering), and more typically, at a frequency within the range of 10-20 MHz, 10-15 MHz, or 12-14 MHz, or, in a preferred embodiment, 13.56 MHz.

The sputtering deposition technique can also be an ion-beam sputtering (IBS) technique. The IBS method produces an ion source in a compartment separate from where the target is contained, and then directs a focused (i.e., collimated) ion beam at the target. The ions leaving the source are typically neutralized by electrons from a second external source. An advantage of IBS is that the energy and flux of ions can be independently adjusted and/or optimized. In addition, since the impacting species are generally neutral (i.e., without charge), IBS can be used for sputtering of both conducting and insulating targets. A variation of IBS is ion-assisted deposition (IAD), in which a secondary ion beam is focused on a substrate, in tandem with the sputtered source of target material also focused on the substrate, such that the secondary ion beam modifies or optimizes the deposition characteristics of the sputtered target material. IAD can, therefore, be used to modify or optimize the structural characteristics of the film deposited on the substrate.

Any of the sputtering deposition techniques contemplated herein can, in addition, be a magnetron sputtering technique. As used herein, a "magnetron sputtering technique" is any sputtering technique in which electrons (and resulting ions of sputter gas) are confined in a region near the target surface by a magnetic (or electromagnetic) field. The magnetic field (typically of several hundred gauss) can be established by, for example, placing a permanent magnet or solenoid near or within a cathode target. As known in the art, the precise magnitude of the magnetic field employed depends to a large extent on the distance from the cathode target (sputtering gun). By confining the electrons close to the target, a significantly increased amount of ionizing collisions occurs near the target surface as compared to the amount of collisions that occur without the magnetic-induced confinement. The increased ionizing collisions advantageously results in a significantly increased sputtering rate of the target material, and hence, a significantly increased deposition rate, as compared to sputtering techniques that do not include a magnetic-induced confinement.

Preferably, regardless of the deposition technique, the technique employs means to adjust the distance between the target and substrate. In preferred embodiments, the depositions are conducted with the substrate being about 4, 5, or 6 cm (and more preferably, about 5 cm) above the cathode target.

Two magnetron sputtering techniques particularly considered herein are DC magnetron sputtering and RF magnetron sputtering. In the DC magnetron sputtering technique, a DC sputtering technique, as described above, is modified by also including magnetic confinement of electrons close to the target. In the RF magnetron sputtering technique, a RF sputtering technique, as described above, is modified by also including magnetic confinement of electrons close to the target. The magnetron sputtering system can have any of the designs and arrangements known in the art, such as a cylindrical type or planar type magnetron sputtering system.

Any of the sputtering deposition techniques contemplated herein can, in addition, be a reactive sputtering technique. In a reactive sputtering technique, sputtered material chemically reacts with (and generally, combines with) at least some portion of the gaseous medium. For example, titanium oxide can be produced by a reactive sputtering technique in which titanium is used as a target in a gaseous medium containing oxygen; or, for example, silicon nitride can be produced by a reactive sputtering technique in which silicon is used as a target in a gaseous medium containing nitrogen. A reactive sputtering technique may also be used to adjust or optimize the stoichiometry of a composition, e.g., to further oxidize an oxygen-deficient perovskite material, such as an oxygen-deficient LMO.

Two reactive sputtering techniques particularly considered herein are DC reactive sputtering and RF reactive sputtering. In the DC reactive sputtering technique, a DC sputtering technique, as described above, is modified by also including in the gaseous medium one or more gaseous components that react with the sputtered target material. In the RF reactive sputtering technique, a RF sputtering technique, as described above, is modified by also including in the gaseous medium one or more gaseous components that react with the sputtered target material. By the same principle, the reactive sputtering technique can also be a magnetron sputtering technique, such as a DC reactive magnetron sputtering technique or a RF reactive magnetron sputtering technique.

Any of the sputtering deposition techniques contemplated herein can, in addition, be modified to operate in a pulsed mode. The pulsed sputtering technique can be, for example, a pulsed DC sputtering technique, such as bipolar pulsed DC sputtering, or a pulsed magnetron sputtering technique, such as high power impulse magnetron sputtering (HIPIMS).

The sputter gas is generally composed, in at least a major proportion, of an inert gas. The inert gas particularly considered herein is a noble gas, most notably argon (Ar), or alternatively, helium (He), neon (Ne), krypton (Kr), or xenon (Xe). Nitrogen ($N_2$) can also be an inert gas when used with a target material not reactive with nitrogen. Some other gases that may be used, either as an inert or reactive gas (depending on the conditions), include hydrogen ($H_2$), oxygen ($O_2$), carbon dioxide ($CO_2$), carbon monoxide (CO), water ($H_2O$), ammonia ($NH_3$), a nitrogen oxide (e.g., NO, $NO_2$, $N_2O$), ozone ($O_3$), a sulfur oxide (e.g., $SO_2$), hydrogen halide (e.g., HF or HCl), or a gaseous hydrocarbon or fluorocarbon (e.g., $CH_4$, $CH_2F_2$, $CF_4$, $C_2H_6$, $C_2F_6$). A combination of any two or more of these gases may also be used. Some particular combinations of sputter gases considered herein include argon-hydrogen (e.g., Ar-4% $H_2$), argon-oxygen (e.g., Ar-4% $O_2$), argon-nitrogen (e.g., Ar-10% $N_2$), argon-water, nitrogen-hydrogen, nitrogen-oxygen, nitrogen-water, $CF_4$-nitrogen, $CF_4$-hydrogen, $CF_4$-oxygen, and $CF_4$—$H_2O$ mixtures. In particular, water vapor may be included in minute amounts (e.g., $1-5\times10^{-5}$ Torr, or a sub-range therein) in order to oxidize a sputtered target material such that the stoichiometric ratio of non-oxygen to oxygen elements is suitably adjusted or optimized.

The sputtering techniques considered herein are generally conducted at a reduced pressure. Generally, the pressure is reduced to a pressure less than about $120\times10^{-3}$ Torr (i.e., 120 mTorr). In different embodiments, depending on the type of sputtering technique being used, the operating pressure can preferably be about, at least, or no more than 110, 100, 90, 80, 70, 60, 50, 40, 30, 20, 15, 12, 11, 10, 9, 8, 7, 6, 5, 4, 3, 2, 1, 0.5, 0.4, 0.3, 0.2, 0.1, 0.05, or 0.01 mTorr, or a pressure within a range bounded by any two of the foregoing exemplary values. Typically, a DC sputtering technique is practiced using an operating pressure at or above 30 mTorr. Typically, a RF sputtering technique or magnetron sputtering technique is practiced using an operating pressure below 30 mTorr. In addition to the operating pressure, the sputtering technique can employ a suitable base pressure (i.e., background pressure of the system). Typically, a suitable base pressure is no more than about $5\times10^{-5}$ Torr. For example, in different embodiments, the base pressure can be about, at least, or no more than $4\times10^{-5}$ Torr, $3\times10^{-5}$ Torr, $2\times10^{-5}$ Torr, $1\times10^{-5}$ Torr, $9\times10^{-6}$ Torr, $8\times10^{-6}$ Torr, $7\times10^{-6}$ Torr, $6\times10^{-6}$ Torr, $5\times10^{-6}$ Torr, $4\times10^{-6}$ Torr, $3\times10^{-6}$ Torr, $2\times10^{-6}$ Torr, or $1\times10^{-6}$ Torr, or a base pressure within a range bounded by any two of the foregoing exemplary values.

In the sputtering deposition method considered herein, the substrate is typically heated in order to make the deposition process more efficient. The temperature at which the substrate is heated is also referred to as the "sputter temperature". Generally, a sputter temperature of at least 500° C. is employed. In different embodiments, the sputter temperature can preferably be about, at least, or no more than 400° C., 425° C., 450° C., 475° C., 500° C., 525° C., 550° C., 575° C., 600° C., 625° C., 650° C., 675° C., 700° C., 725° C., 750° C., 775° C., 800° C., 825° C., 850° C., 875° C., or 900° C., or a sputter temperature within a range bounded by any two of the foregoing exemplary values. In one embodiment, the sputter temperature is maintained at a specific temperature, or substantially maintained at a specific temperature (i.e., within ±5° C. of a specific temperature), during the sputtering operation. In another embodiment, the sputter temperature is changed (i.e., by more than ±5° C.) during the sputtering operation. In different embodiments, the sputter temperature is increased, or decreased, or increased to a peak temperature and decreased, or decreased to a base temperature and then increased, during the sputtering operation. In some embodiments, the sputter temperature is changed at a constant or substantially constant rate (i.e., linear or substantially linear rate), while in other embodiments, the sputter temperature is changed by a changing (i.e., non-linear) rate during the sputtering process.

The sputtering time (i.e., time that target is being sputtered and deposited on substrate) is very much dependent, first, on the desired thickness of the film (i.e., longer sputtering times generally produce thicker films), and second, on the conditions employed (e.g., sputtering pressure, sputter temperature, sputtering power, and overall sputtering efficiency) in the sputtering technique. Accordingly, in some embodiments, the sputtering time can be as short as a few minutes (e.g., 1, 2, 3, 4, 5, 10, or 15 minutes), while in other embodiments, the sputtering time can be, for example, 20, 30, 40, 50, 60, 70, 80, 90, 100, 110, 120, 150, 180 minutes, or more.

Regardless of deposition technique, the thickness of the phase-separated layer 14 is, generally, desirably at least 5 nm thick. In different embodiments, the phase-separated layer 14 can be about, at least, or no more than 5 nm, 10 nm, 15 nm, 20 nm, 25 nm, 30 nm, 40 nm, 50 nm, 60 nm, 70 nm, 80 nm, 90 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 310 nm, 320 nm, 330 nm, 340 nm, 350 nm, 360 nm, 370 nm, 380 nm, 390 nm, 400 nm, 410 nm, 420 nm, 430 nm, 440 nm, 450 nm, 460 nm, 470 nm, 480 nm, 490 nm, 500 nm, 550 nm, 600 nm, 650 nm, 700 nm, 750 nm, 800 nm, 850 nm, 900 nm, 950 nm, 1000 nm, 1100 nm, 1200 nm, 1300 nm, 1400 nm, or 1500 nm n, or a thickness within a range bounded by any two of the foregoing values.

The sputter power is generally at least 20 Watts (20 W). In different embodiments, the sputter power is about, at least, or no more than about 20, 30, 40, 50, 60, 70, 80, 90, 100, 110, 120, 130, 140, 150, 160, 170, 180, 190, or 200 Watts, or a power within a range bounded by any two of the foregoing values.

The sputter power and other conditions are preferably adjusted such that a deposition rate of at least 0.01 nm/s is attained. In different embodiments, conditions of the sputtering process are adjusted such that a deposition of about or at least 0.01, 0.02, 0.03, 0.04, 0.05, 0.06, 0.07, 0.08, 0.09, 0.10, 0.11, 0.12, 0.13, 0.14, 0.15, 0.16, 0.17, 0.18, 0.19, or 0.20 nm/s is attained.

In some exemplary methods, a pre-annealing step can be performed on the primary substrate prior to deposition of the target material on the substrate. In a typical pre-annealing step, the primary substrate is placed in a closed chamber (e.g., the deposition chamber), an annealing gas (preferably, any of the inert sputtering gases described above) is introduced into the chamber, and the pressure is reduced to a suitable low pressure, such as 1, 2, or 3 mTorr, or any of the low pressures described above. The temperature of the primary substrate can be simultaneously or subsequently increased to a suitable annealing temperature (e.g., 700° C., 720° C., or 740° C., or any of the elevated temperatures described above for the sputter temperature). The temperature is preferably increased at a set rate, such as 80° C./min., 90° C./min., 100° C./min., 110° C./min., 120° C./min., 130° C./min., 140° C./min., or 150° C./min. Once the primary substrate reaches the desired annealing temperature, the primary substrate is preferably maintained at the annealing temperature for at least, for example, 10, 15, 30, or 45 minutes, depending on the annealing temperature and other factors.

After a phase-separated layer 14 has been deposited on the primary substrate, the primary substrate is typically cooled to a suitable cooled temperature. The suitable cooled temperature is typically room temperature, which is typically a temperature within about 15-30° C., or about 25° C. In some embodiments, the primary substrate is rapidly cooled (e.g., at a rate of at least 10, 15, 20, 30, 40, or 50° C./min., or within a range therein), while in other embodiments, the primary substrate is more slowly cooled (e.g., at a rate if less than 10° C./min., or about 5, 4, 3, 2, or 1° C./min., or within a range therein).

Regardless of the deposition technique used, the resulting primary substrate with deposited phase-separated layer (i.e., the treated substrate) can be subjected to a post-processing step. The post-processing step can function, for example, to promote, modify, adjust, or optimize a phase separation of components. The post-processing step can be a heating step, cooling step (i.e., below room temperature), pressurization, depressurization, radiation exposure step (e.g., UV, microwave, electron beam, or ion beam radiation), or a chemical exposure step (e.g., contact of the treated substrate with a vapor phase or liquid phase chemical or mixture of chemicals). In one embodiment, the post-processing step is conducted on the treated substrate while the treated substrate is at the temperature assumed upon completion of the sputtering deposition process. In another embodiment, the post-processing step is conducted on the treated substrate after it has been cooled to, for example, room temperature, and post-processed either in the cooled state or in a subsequently elevated temperature state.

Regardless of the deposition technique used, the post-processing step can include a heating step, such as a post-annealing step. The heating may be conducted at typical ambient pressure (e.g., 1 atm), reduced pressure (e.g., a pressure below 1 atm, or any of the reduced pressures described above), or elevated pressure (e.g., greater than 1 atm). The heating can be conducted under any suitable atmosphere, such as air, or alternatively, an artificial inert or reactive gas, such as any of the sputter gases and combinations thereof described above. The post-annealing temperature is preferably any of the sputter temperatures described above (e.g., 750-800° C.). The post-annealing time is dependent on several factors, including the applied temperature. In different embodiments, the post-annealing time can be any of the sputtering times given above (e.g., 15 minutes to 2 hours). After the post-annealing step, the treated substrate can be cooled in a gradual or rapid manner, such as described above after sputtering is completed.

In another aspect, the invention is directed to a method for producing a superconducting film or tape containing pinning defects therein. The pinning defects in the superconductor arise by deposition (e.g., epitaxial or non-epitaxial deposition) of the superconductor on the phase-separated layer described above. As used herein, the term "epitaxial deposition", as used for the superconducting film, indicates that at least some portion of the superconducting film is epitaxially deposited on the surface of the phase-separated layer.

Antiphase boundaries in the electronically active layer may arise due to crystallographic mismatching between an epitaxially grown superconducting film on one phase-separated component and an epitaxially grown superconducting film on another phase-separated component. The crystallographic mismatching within the superconducting film grown on different phase-separated components can be any type of crystallographic mismatching. As understood in the art, an anti-phase boundary occurs at the interface of crystalline portions while having the same overall crystallographic orientation. Lattice planes are mismatched across the anti-phase boundary.

In other exemplary device layers, the portions of superconducting film grown on different phase-separated components are crystallographically mismatched by being crystallographically different in either orientation or pattern. For example, a superconducting film grown on one phase-separated component can be in-plane rotated compared to superconducting film grown on another phase-separated component, or superconducting film grown on one phase-separated component can be polycrystalline while superconducting film grown on another phase-separated component is substantially or completely crystalline, or superconducting film grown on one phase-separated component can be amorphous (i.e., not crystalline or polycrystalline) while superconducting film grown on another phase-separated component is substantially or completely crystalline.

Electronically active layers 26 grown on the phase-separated layer 14 will contain (as propagated through the superconducting film during growth thereof) the nanoscale or microscale features (i.e., morphological features) of the phase-separated layer. The features transmitted to the electronically active layer 26 function as defects in the superconducting film. For example, since the features of the phase-separated layer 14 include crystallographic mismatching between different phases, this crystallographic mismatching will be transmitted to the electronically active layer and function as defects therein. Because these features from which defects arise are propagated into the electronically active layer 26 during epitaxial or non-epitaxial growth of the electronically active layer 26 on the phase-separated layer 14, the features are generally disposed linearly (for example, as columns) in the electronically active layer 26 in an orientation generally perpendicular to the surface 18 (or parallel to the direction of film growth). Such defects are also referred to herein as linear defects. However, it is contemplated herein that conditions can be employed that could provide for non-linear (for example, curved or bent) propagation of defects through the electronically active layer 26. Furthermore, it is contemplated that conditions can be employed that could provide for linearly or non-linearly propagated features to depart from a perpendicular orientation to the surface (for example, within −45 to −45 degrees, +60 to −60 degrees, +80 to −80 degrees, or +85 to −85 degrees from the surface).

The thickness (e.g., width) of columnar or other features in the electronically active layer 26 arising from the phase-separated layer 14 is generally of nanoscale dimension, i.e., less than 1 μm thick. For example, in different embodiments, column thicknesses can be less than 500 nm, or less than 200 nm, or less than 100 nm, or less than 50 nm, or less than 20 nm, or less than 10 nm. However, larger thicknesses of columnar features are also contemplated, including those having micron-scale features (e.g., up to 1, 5, 10, or 50 microns). More typically, the average diameter of the nanoscale defects in the electronically active layer 26 is in the range of 1-100 nm.

In cases where more than one epitaxial orientation of the electronically active layer 26 is possible on a phase-separated layer 14, the conditions for the deposition of the electronically active layer 26 can be appropriately adjusted, such that the electronically active layer 26 is deposited on the phase-separated layer 14 in one of the epitaxial orientations and not the other (i.e., one of the epitaxial orientations is favored). The ability to select epitaxial orientations in this manner provides the capability of incorporating numerous other morphological features into the electronically active layer 26 beyond what has been described above.

Where the electronically active layer 26 is a superconducting film, the superconducting layer can be any of the high temperature superconductor (HTS) materials known in the art. A high temperature superconducting material is generally characterized by having a superconducting critical temperature ($T_c$) of at least 35 K, and more preferably, greater than 77 K. Currently, a majority of the HTS materials belong to the general class of copper oxide superconducting materials.

In one embodiment, the electronically active layer can be a superconducting film that includes a rare-earth (RE) or transition metal (TM) barium copper oxide composition (hereinafter, a "metal-barium-copper-oxide" composition). The rare earth element can be any of the lanthanide or actinide metals listed in the Periodic Table of the Elements (hereinafter, the "Periodic Table") and as exemplified above. The lanthanide metals refer predominantly to the elements of the Periodic Table having an atomic number of 57 to 71. The actinide metals generally refer to any of the elements of the Periodic Table having an atomic number of 90 to 103. The transition metals generally refer to any of the elements located in Groups 3-12 of the Periodic Table (i.e., the corresponding scandium through zinc groups). In a particular embodiment, the metal-barium-copper-oxide material is according to the formula $(RE)Ba_2Cu_3O_7$, wherein RE is a rare earth or transition metal element. Some examples of suitable RE metals include yttrium (Y), neodymium (Nd), gadolinium (Gd), thulium (Tm), ytterbium (Yb), lutetium (Lu), and combinations thereof.

For example, where the electronically active layer is a superconducting layer, the superconducting material can be a yttrium barium copper oxide (YBCO) material. Any of the yttrium barium copper oxide materials known in the art can be used herein. In one instance, the yttrium barium copper oxide material can be generally described by the formula $YBa_2Cu_3O_{7-x}$, wherein x is generally a number within the approximate range $0 \leq x \leq 1$. As used herein, the formula $YBa_2Cu_3O_7$ is ascribed the same meaning, and includes all of the possible different variations, as encompassed by the former broader formula. Some examples of other types of yttrium barium copper oxide materials include $Y_3Ba_4Cu_7O_{16}$, $Y_2Ba_4Cu_7O_{15}$, $Y_2CaBa_4Cu_7O_{16}$, $(Y_{0.5}Lu_{0.5})Ba_2Cu_3O_7$, $(Y_{0.5}Tm_{0.5})Ba_2Cu_3O_7$, and $(Y_{0.5}Gd_{0.5})Ba_2Cu_3O_7$.

In another exemplary superconductor material, the high temperature superconducting film includes a thallium-containing barium copper oxide composition. More particularly, the composition may be a thallium barium calcium copper oxide material. Any of the thallium barium calcium copper oxide materials can be used herein. In one instance, the thallium barium calcium copper oxide material includes a composition according to the formula $TlBa_2Ca_{n-1}Cu_nO_{2n+3}$, wherein n is generally a number greater than 1 and up to 4. In another instance, the thallium barium calcium copper oxide material includes a composition according to any of the formulas $Tl_2Ba_2Ca_{n-1}Cu_nO_{2n+2}$, $Tl_2Ba_2Ca_{n-1}Cu_nO_{2n+3}$, or $Tl_2Ba_2Ca_{n-1}Cu_nO_{2n+4}$, wherein n is generally a number greater than 1 and up to 4. Some specific examples of such superconducting compositions include $Tl_2Ba_2Ca_2Cu_3O_{10}$ (TBCCO-2223), $Tl_2Ba_2CaCu_2O_6$, $TlBa_2Ca_2Cu_3O_9$, and $TlBa_2Ca_3Cu_4O_{11}$.

Alternately, the superconductor layer can be a high temperature superconducting film includes a mercury-containing barium copper oxide material. More particularly, the composition may be a mercury barium calcium copper oxide material. Any of the mercury barium calcium copper oxide materials can be used herein. In a particular embodiment, the mercury barium calcium copper oxide material includes a composition according to the formula $HgBa_2Ca_{n-1}Cu_nO_{2n+2}$, wherein n is a number greater than 1 and up to 4. Some specific examples of such superconducting compositions include $HgBa_2Ca_2Cu_3O_8$, $HgBa_2Ca_2Cu_4O_{10}$, to $HgBa_2(Ca_{1-a}Sr_a)Cu_3O_8$ (wherein $0 \leq a \leq 1$), and $(Hg_{0.8}Tl_{0.2})Ba_2Ca_2Cu_3O_{8+x}$.

The high temperature superconducting film can includes a bismuth- and/or strontium-containing calcium copper oxide material. More particularly, the composition may be a bismuth strontium calcium copper oxide (BSCCO) material, Any of the BSCCO materials can be used herein. In a particular embodiment, the BSCCO material includes a composition according to the formula $Bi_2Sr_2Ca_nCu_{n+1}O_{2n+6}$. Some specific examples of such superconducting compositions include $Bi_2Sr_2CaCu_2O_8$ (BSCCO-2212) $Bi_2Sr_2Ca_2Cu_3O_{10}$ (BSCCO-2223), $Bi_2Sr_2CaCu_2O_9$, and $Bi_2Sr_2(Ca_{0.8}Y_{0.2})Cu_2O_8$.

The HTS film can also include a lanthanum-containing copper oxide material. The lanthanum-containing copper oxide material can include a composition according to the general formula $La_{2-x}MN_xCuO_4$, wherein x is greater than zero and less than 2, and M is an alkaline earth metal ion, such as Mg, Ca, Sr, or Ba. Some specific examples of such superconducting materials include $La_{1.85}Ba_{0.15}CuO_4$ (LBCO) and $La_{1.85}Sr_{0.15}CuO_4$ (LSCO).

Any of the superconducting materials described above can include dopant amounts of other metals that may be included to facilitate certain desired properties of the HTS film. Some examples of rare earth dopants include yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tn), ytterbium (Yb), lutetium (Lu), or a combination thereof. In a particular embodiment, YBCO film compositions are doped with one or more of the above rare earth metals.

The electronically active layer can also be composed of one more than one electronically active layer. For example, the electronically active layer can be a superconductor layer than includes a YBCO layer deposited on a BSCCO layer, or vice-versa.

Where the electronically active layer is a superconducting film, the superconducting film can be of any suitable thickness. For electrical power applications, the thickness is typically no more than about 5 microns (5 μm) thick, and more typically no more than about 10 μm thick. For example, in different embodiments, the thickness of the superconducting film can be about 5, 4, 3, 2, or 1 μm. However, the thickness is highly dependent on the particular application, and thus, can be of significantly greater thickness (e.g., 10, 15, 20, 25 or more microns), or alternatively, of much lesser thickness (e.g., no more than 1, 0.5, 0.2, or 0.1 microns).

Where the electronic component includes a flux-pinned superconducting film, the film can be part of a tape or wire that exhibits improved superconducting properties. As generally understood in the art, a tape or wire generally refers to an article having a width dimension much smaller than its length dimension. The tape or wire can have a length of, for example, at least 0.1 meters (0.1 m), 0.5 m, 1 m, 5 m, 10 in, 50 m, 100 m, 1 km, or more.

The electronically active layer can also be coated with any of a variety of materials that can serve a useful purpose. For example, a non-superconducting metal layer may be applied on the superconducting film to protect the film, such as for corrosion resistance. Alternatively, a coating (e.g., metallic, polymeric, plastic, rubber, paint, or hybrid) can be applied onto the superconducting layer to provide, for example, electrical or magnetic insulation, or a certain level of rigidity or flexibility.

The electronically active layer can be deposited by any suitable method known in the art. For example, the electronically active layer can be deposited by physical vapor deposition (PVD), chemical vapor deposition (CVD), a sputtering technique (such as any of the sputtering techniques described above), sol-gel, dip coating, electrodeposition, spray pyrolysis, and the like. The PVD technique can be a laser ablation technique, such as pulsed laser deposition (PLD). In another embodiment, the films are deposited by a molecular beam chemical vapor deposition (MOCVD) technique.

Superconducting tape produced by the methods described herein can be used in place of any traditional wiring. In particular, the superconducting tape can be used in, for example, a fault current limiter, power transmission cable, electromagnet coil (i.e., superconducting magnet), motor, turbine, transformer, pump, compressor, communication device (e.g., radiofrequency device), wireless device, engine (e.g., in motor vehicle), power storage device, or electrical generator.

Examples have been set forth below for the purpose of illustration and to describe the best mode of the invention at the present time. However, the scope of this invention is not to be in any way limited by the examples set forth herein.

EXAMPLE 1

Deposition of a Phase-Separated LMO:$Al_2O_3$ Layer on a Homo-epi-MgO/IBAD-MgO Substrate The Substrate RE magnetron sputtering was employed to deposit phase-separated layers on a "Homo-epi-MgO/IBAD-MgO" substrates or templates. The substrate referred to as "Homo-epi-MgO/IBAD-MgO" refers to a substrate that includes a Homo-epi-MgO buffer layer deposited on an IBAD-MgO buffer layer that is deposited on a $Y_2O_3/Al_2O_3$ layer that is deposited on a Ni-based alloy substrate. The substrates used in this study were fabricated according to the method described in X. M. Xiong, et al., "High Throughput Processing of Long-length IBAD MgO and Epi-buffer Templates at SuperPower", *IEEE Trans. Appl. Supercond.*, 17, 3375 (2007).

Homo-epi-MgO/IBAD-MgO Substrate

The fourth layer of the Homo-epi-MgO/IBAD-MgO substrate was a fourth layer of 20 nm thickness of reactively sputtered (approximately at 600° C.) homo-epitaxial MgO. The homo-epi MgO layer ensures structural robustness of IBAD-MgO by further improving the texture and restoring the surface lattice constant to that of the bulk MgO (0.421 nm). (P. N. Arendt, et al., "High Critical Current YBCO Coated Conductors Based on IBAD MgO", *Physica C*, 412, 795 (2004)). The measured lattice constant at the as-deposited surface of IBAD-MgO is known to vary between 0.43-0.44 nm.

In-Situ Annealing of Substrate Prior to Deposition of LMO:$Al_2O_3$ Phase-Separated Layer As the MgO surface is known to be hygroscopic, an annealing process was performed on the substrate of the MgO surface prior to deposition of the phase-separated layer. The annealing process was conducted in a manner that removes surface-adsorbed water and hydrocarbons. Removal of these species ensures a chemically clean surface for the reproducible growth of subsequent LMO:$Al_2O_3$ composite layers. The annealing process included the following steps:
 1. The annealing gas, in this case, a mixture of Ar, $H_2$ (4%) and $O_2$, was introduced into the deposition chamber, and the total chamber pressure adjusted to $5\times10^{-3}$ Torr.
 2. The temperature of the substrate was increased from room temperature (RT) to 750° C. at a rate of 140° C./min.
 3. The substrate was in-situ annealed for 30-45 minutes at 750° C. in the presence of the annealing gas.
 4. Following step 3, the pressure in the chamber was set to a sputtering pressure of $7\times10^{-3}$ Torr before the sputtering deposition step of the phase-separated layer was started.

Radiofrequency (RF) Sputtering Process Used for Deposition of LMO:$Al_2O_3$ Phase-Separated Laser An RF sputtering system was used to deposit the phase-separated layer. The RF sputtering system included a vacuum deposition chamber equipped with a halogen lamp heater assembly. The sputter cathode used was a two-inch in diameter commercial Kurt J. Lesker sputter source driven by rf or dc power supplies. The depositions took place in sputter-up configuration. The chamber was pumped down to $10^{-2}$ Torr by a mechanical pump, followed by a turbo pump that further reduced the base-pressure down to $10^{-5}$ Torr. The sputter or annealing gas was delivered into the chamber by MKS mass flow controllers. The pressure of the system was controlled by a manually-operated gate valve.

The sputter target was made from a mixture of stoichiometric LMO powder, prepared by solid state reaction, and commercially available $Al_2O_3$ powder, which was packed into a two-inch copper tray. The $Al_2O_3$ composition in the target was 25 vol-%, with the LMO comprising the remaining 75 vol-%. Depositions were conducted in a Ar—$H_2$ (4%) and $O_2$ gas mixture and at a substrate temperature of 780° C. This was followed by post annealing in a tube furnace for 2 hours at 800° C. in order to further develop the phase segregation.

The following conditions were employed for the RF sputtering deposition of the LMO:$Al_2O_3$ phase-separated layer:
 Base Pressure (Background pressure of the system): $\sim2\times10^{-5}$ Torr.
 Sputter Pressure: $7\times10^{-3}$ Torr
 Sputter Temperature (Substrate Temperature): 750° C.
 Sputter Time: 1 hr 30 min (for all substrates)
 Sputter Power: 80 Watt
 Sputter Gas: For all substrates, a mixture of $O_2$ and Ar—H (4%) with a flow ratio of 1/5 respectively.

The above procedure resulted in a layer of phase-separated LMO:$Al_2O_3$ of 210 nm thickness.

After the above sputtering procedure was completed, the coated substrate was cooled as follows:
 1) Gas flow into the chamber was stopped.
 2) The temperature was then decreased to room temperature by turning off the power of the substrate heater and waiting for the heater assembly to cool down to room temperature. About two hours was required for the temperature to drop from 700° C. to 24° C., During the cooling procedure, the deposition chamber was maintained under a reduced pressure of about $2\times10^{-5}$ Torr.
 3) The coated substrates were removed from the deposition chamber at room temperature.

Post-Annealing of the LMO:$Al_2O_3$-Coated Substrate after the Sputtering Deposition Procedure Post-annealing was performed in a pre-heated tube furnace under a flowing Ar atmosphere at 1 atm pressure. The annealing temperature was 800° C. Post-annealing gas was introduced before the samples were inserted into the tube in order to purge out any residual gas. The tube was purged for about 5-10 minutes before introducing the samples therein. Samples were then inserted into the pre-heated furnace with a rod assembly. Annealing time was about two hours. After the post-annealing procedure, the samples were cooled to room temperature by pulling the rod assembly out of the hot zone, during which time the gas flow was maintained at 1 Atm. The cooling process proceeded under gas flow for about 40-50 minutes. The samples were then removed from the furnace.

EXAMPLE 2

Analysis of the Phase-Separated Layer in the LMO:$Al_2O_3$-Coated Substrate

X-Ray Diffraction Measurements

Figure 2:
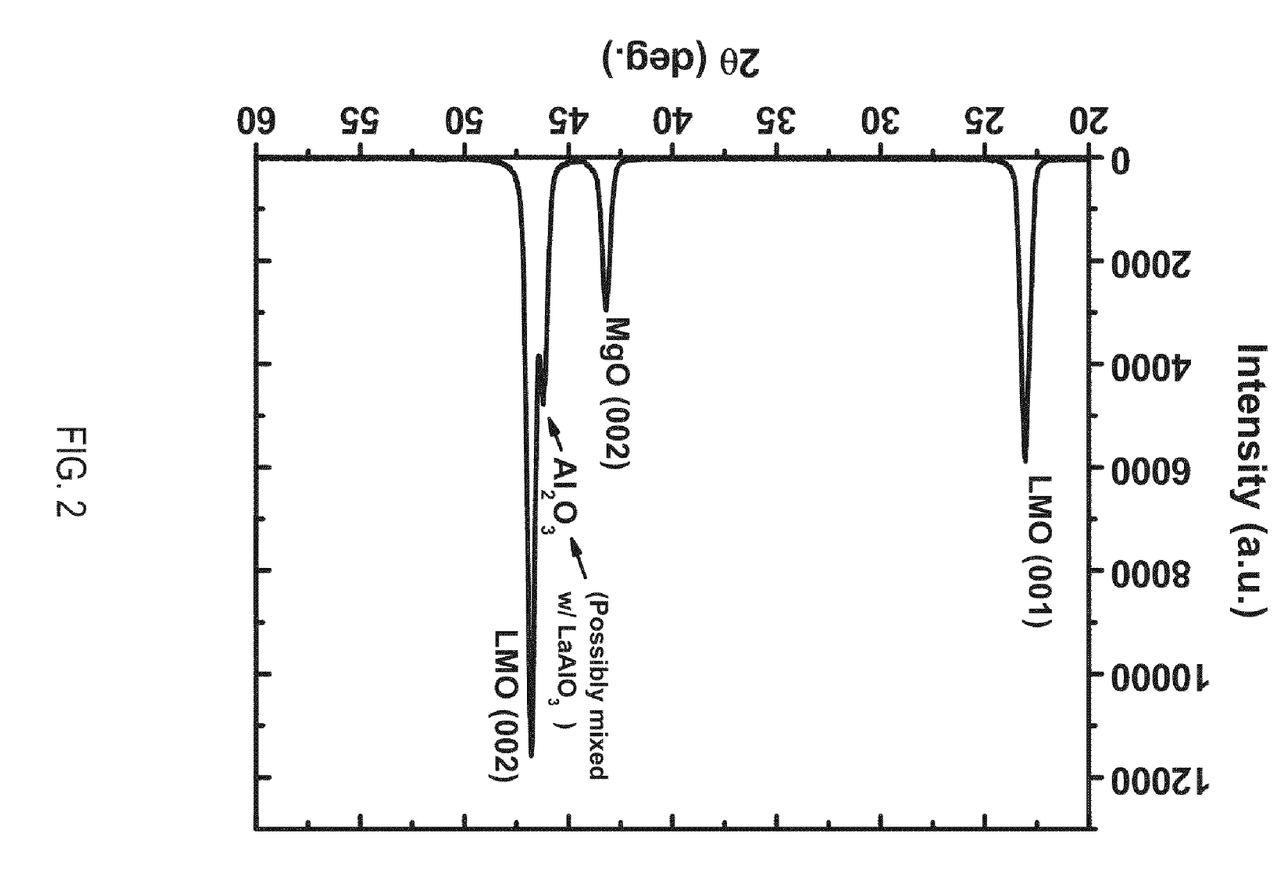
FIG. 2 is the X-ray $\theta$-$2\theta$ diffraction pattern of an LMO-$Al_2O_3$ composite film on LMO/IBAD-MgO template, showing separation of LMO and $Al_2O_3$ phases.

FIG. 2 shows an X-ray θ-2θ diffraction patter for a LMO:$Al_2O_3$ (25 vol %) composite film deposited directly on a LMO/Homo-epi-MgO/IBAD-MgO template. The diffraction pattern shows the separation of LMO, $LaAlO_3$ (LAO), and gamma-$Al_2O_3$ phases. The phase-separated films also display a preferred c-axis orientation. This demonstrates a possibility of phase separating more than two phases with self-assembly via $LaMnO_3$, $LaAlO_3$, and gamma-$Al_2O_3$, $LaAlO_3$ forms due to the reaction of $Al_2O_3$ with $LaMnO_3$.

FIGS. 3A and B are the Z-contrast scanning transmission electron microscopy image of LMO:$Al_2O_3$/LMO/homo-epi MgO/IBAD-MgO, and high magnification image of LMO:$Al_2O_3$ composite layer, respectively. FIG. 3B reveals the light bright regions separated by darker columnar segments indicating the presence of Al-rich nanocolumns (dark contrast regions) within the film matrix. This correlates well with the X-ray θ-2θ diffraction pattern shown in FIG. 2.

While there have been shown and described what are at present considered the preferred embodiments of the invention, it will be obvious to those skilled in the art that various changes and modifications can be prepared therein without departing from the scope of the inventions defined by the appended claims. For example, in addition to high temperature superconductor layers, other active semiconductor layers could be deposited on these phase-separated layers.

We claim:

1. An electronic component comprising:
   a substrate; and
   a phase-separated layer supported on said substrate, wherein said phase-separated layer comprises:
      a first phase comprising lanthanum manganate (LMO), and
      a second phase selected from the group consisting of a metal oxide (MO), metal nitride (MN), a metal (Me), and combinations thereof, wherein:
         MO=$Al_2O_3$, $Ba_xNb_yO_z$, $Ba_xTa_yO_z$, $Ba_xSn_yO_z$, $Ba_xAl_yO_z$, ZnO, $BiFeO_3$, $BaTiO_3$, $La_xTa_yO_z$, $La_xNb_yO_z$, $LaAlO_3$, and combinations thereof;
         MN=TiN, ZrN, YN, VN, WN, GaN, AlN, HfN, TaN, NbN, InN, $Si_3N_4$, $Zn_3N_2$, and combinations thereof; and
         Me=Pd, Ta, Zr, Ti, Ir, Hf, Pt, Au, Ni, Zn, Mg, Cu, Al, and combinations thereof.

2. The electronic component according to claim 1, wherein the phase-separated layer is supported on a buffer layer comprising a composition selected from the group consisting of IBAD MgO, LMO/IBAD-MgO, homoepi-IBAD MgO and LMO/homoepi-MgO.

3. The electronic component according to claim 1, wherein said first phase is a continuous phase and said second phase is a discontinuous phase.

4. The electronic component according to claim 1, wherein a weight ratio of said first phase to said second phase ranges from 1:99 to 99:1.

5. The electronic component according to claim 1, wherein an upper surface of said phase-separated layer comprises interfaces between said first phase and said second phase.

6. The electronic component according to claim 5, wherein a shape of said interfaces is selected from the group consisting of circular, rectangular, hexagonal and polyhedral.

7. The electronic component according to claim 1, further comprising an electronically active layer supported on said phase-separated layer.

8. The electronic component according to claim 7, wherein said electronically active layer is selected from the group consisting of a superconducting material, a ferroelectric material, a multiferroic material, a magnetic material, a photovoltaic material, a electrical storage material, and a semiconductor material.

9. The electronic component according to claim 1, wherein said second phase comprises a metal oxide (MO).

10. The electronic component according to claim 1, wherein said second phase comprises a metal nitride (MN).

11. The electronic component according to claim 1, wherein said second phase comprises a metal (Me).

12. The electronic component according to claim 1, further comprising a biaxially-textured layer having a composition selected from the group consisting of IBAD MgO, LMO/IBAD-MgO, homoepi-IBAD MgO and LMO/homoepi-MgO, wherein the phase-separated layer is deposited on said biaxially-textured layer.

13. The electronic component according to claim 12, wherein said phase-separated layer is an epitaxial layer.

14. The electronic component according to claim 12, wherein an upper surface of said phase-separated layer comprises interfaces between said first phase and said second phase.

15. The electronic component according to claim 12, further comprising: a superconductor layer supported on said phase-separated layer.

16. A method of making an electronic component, said method comprising:
    providing a substrate; and
    forming a phase-separated layer supported on said substrate, wherein said phase-separated layer comprises:
       a first phase comprising lanthanum manganate (LMO), and
       a second phase selected from the group consisting of a metal oxide (MO), metal nitride (MN), a metal (Me) and combinations thereof, wherein:
          MO=$Al_2O_3$, $Ba_xNb_yO_z$, $Ba_xTa_yO_z$, $Ba_xSn_yO_z$, $Ba_xAl_yO_z$, ZnO, $BiFeO_3$, $BaTiO_3$, $La_xTa_yO_z$, $La_xNb_yO_z$, $LaAlO_3$, and combinations thereof;
          MN=TiN, ZrN, YN, VN, WN, GaN, AlN, HfN, TaN, NbN, InN, $Si_3N_4$, $Zn_3N_2$, and combinations thereof; and
          Me=Pd, Ta, Zr, Ti, Ir, Hf, Pt, Au, Ni, Zn, Mg, Cu, Al, and combinations thereof.

17. The method according to claim 16, wherein said forming step comprises providing:
    a first material for forming said first phase, and a second material for forming said second phase; and
    depositing said phase-separated layer by a technique selected from the group consisting of sputtering, pulsed laser deposition, e-beam evaporating, metal organic chemical vapor deposition, and metal organic deposition.

18. The method according to claim 16, further comprising: forming an electronically active layer supported on said phase-separated layer.

19. The method according to claim 16, further comprising: annealing said phase-separated layer.

20. The method according to claim 16, further comprising: forming a buffer layer supported on said substrate, said buffer layer comprising a composition selected from the group consisting of IBAD MgO, LMO/IBAD-MgO, homoepi-IBAD MgO and LMO/homoepi-MgO, wherein said phase-separated layer is supported on said buffer layer.

* * * * *